US012746618B2

(12) United States Patent
Kawasuji et al.

(10) Patent No.: US 12,746,618 B2
(45) Date of Patent: Sep. 29, 2026

(54) LASER PROCESSING APPARATUS INCLUDING A HOLE IN A WORKPIECE HAVING A RESIN LAYER, LASER PROCESSING METHOD, AND ELECTRONIC DEVICE MANUFACTURING METHOD HAVING THE SAME

(71) Applicant: Gigaphoton Inc., Tochigi (JP)

(72) Inventors: Yasufumi Kawasuji, Oyama (JP); Yasuhiro Adachi, Oyama (JP); Akira Suwa, Oyama (JP)

(73) Assignee: Gigaphoton Inc., Tochigi (JP)

( * ) Notice: Subject to any disclaimer, the term of this patent is extended or adjusted under 35 U.S.C. 154(b) by 362 days.

(21) Appl. No.: 18/399,043

(22) Filed: Dec. 28, 2023

(65) Prior Publication Data

US 2024/0173796 A1 May 30, 2024

Related U.S. Application Data

(63) Continuation of application No. PCT/JP2021/031968, filed on Aug. 31, 2021.

(51) Int. Cl.
*B23K 26/066* (2014.01)
*H10W 99/00* (2026.01)
*H10W 90/00* (2026.01)

(52) U.S. Cl.
CPC ........... *B23K 26/066* (2015.10); *H10W 99/00* (2026.01); *H10W 90/724* (2026.01)

(58) Field of Classification Search
CPC . B23K 26/066; H10W 999/00; H10W 99/724
(Continued)

(56) References Cited

U.S. PATENT DOCUMENTS 5,386,430 A 1/1995 Yamagishi et al.
9,168,614 B2 10/2015 Schmidt et al.
(Continued)

FOREIGN PATENT DOCUMENTS

JP S63-133522 A 6/1988
JP H04-314321 A 11/1992
(Continued)

OTHER PUBLICATIONS

International Search Report issued in PCT/JP2021/031968; mailed Nov. 22, 2021.
(Continued)

*Primary Examiner* — Phuc T Dang
(74) *Attorney, Agent, or Firm* — Studebaker Brackett PLLC

(57) ABSTRACT

A laser processing apparatus forms a hole in a workpiece having a resin layer on a processing surface by irradiating the workpiece with a laser beam discharge-excited between a pair of discharge electrodes, and includes a laser apparatus that outputs the laser beam having a first divergence angle in a discharge direction between the pair of discharge electrodes larger than a second divergence angle in a direction perpendicular to the discharge direction and a laser beam traveling direction, a transfer mask that forms a transfer pattern, an introducing optical system for guiding the laser beam to the transfer mask, a projection optical system that images the transfer pattern on the resin layer, and a divergence angle adjusting optical system that is disposed on an optical path of the laser beam and adjusts a difference between the first divergence angle and the second divergence angle to be reduced.

19 Claims, 28 Drawing Sheets

(58) Field of Classification Search
USPC .......................................................... 438/125
See application file for complete search history.

(56) References Cited

U.S. PATENT DOCUMENTS

| | | | |
|---|---|---|---|
| 2004/0036977 | A1 | 2/2004 | Tanaka et al. |
| 2007/0139634 | A1 | 6/2007 | Mulder |

FOREIGN PATENT DOCUMENTS

| | | | | | |
|---|---|---|---|---|---|
| JP | H06-087087 | A | | 3/1994 | |
| JP | H10-314965 | A | | 12/1998 | |
| JP | 2004-056103 | A | | 2/2004 | |
| JP | 2007-194600 | A | | 8/2007 | |
| JP | 2008135631 | A | * | 6/2008 | |
| JP | 5274128 | B2 | * | 8/2013 | ........... G03F 7/0002 |
| JP | 2017-051990 | A | | 3/2017 | |
| JP | 2017-186185 | A | | 10/2017 | |
| JP | 2020519015 | A | * | 6/2020 | ........ H10W 20/0245 |
| WO | WO-2019146021 | A1 | * | 8/2019 | ........... B23K 26/382 |

OTHER PUBLICATIONS

Written Opinion issued in PCT/JP2021/031968; mailed Nov. 22, 2021.

* cited by examiner

LASER PROCESSING APPARATUS INCLUDING A HOLE IN A WORKPIECE HAVING A RESIN LAYER, LASER PROCESSING METHOD, AND ELECTRONIC DEVICE MANUFACTURING METHOD HAVING THE SAME

CROSS-REFERENCE TO RELATED APPLICATIONS

The present application is a continuation application of International Application No. PCT/JP2021/031968, filed on Aug. 31, 2021, the entire contents of which are hereby incorporated by reference.

BACKGROUND

1. Technical Field

The present disclosure relates to a laser processing apparatus, a laser processing method, and an electronic device manufacturing method.

2. Related Art

Recently, in a semiconductor exposure apparatus, improvement in resolution has been desired for miniaturization and high integration of semiconductor integrated circuits. For this purpose, an exposure light source that outputs light having a shorter wavelength has been developed. For example, as a gas laser apparatus for exposure, a KrF excimer laser apparatus that outputs a laser beam having a wavelength of about 248.0 nm and an ArF excimer laser apparatus that outputs a laser beam having a wavelength of about 193.4 nm are used.

Spectral linewidths of spontaneous oscillation beams of the KrF excimer laser apparatus and the ArF excimer laser apparatus are as wide as from 350 pm to 400 pm. Therefore, when a projection lens is formed of a material that transmits ultraviolet light such as a KrF laser beam and an ArF laser beam, chromatic aberration may occur. As a result, the resolution may decrease. Given this, the spectral linewidth of the laser beam output from the gas laser apparatus needs to be narrowed to an extent that the chromatic aberration is ignorable. Therefore, in a laser resonator of the gas laser apparatus, a line narrowing module (LNM) including a line narrowing element (etalon or grating, etc.) may be provided in order to narrow the spectral linewidth. Hereinafter, a gas laser apparatus with a narrowed spectral linewidth is referred to as a line narrowing gas laser apparatus.

LIST OF DOCUMENTS

Patent Documents

Patent Document 1: Japanese Unexamined Patent Application Publication No. 2017-186185
Patent Document 2: U.S. Pat. No. 9,168,614
Patent Document 3: Japanese Unexamined Patent Application Publication No. 2017-51990
Patent Document 4: Japanese Unexamined Patent Application Publication No. 10-314965

SUMMARY

A laser processing apparatus according to one aspect of the present disclosure forms a hole in a workpiece having a resin layer disposed on a processing surface by irradiating the workpiece with a laser beam discharge-excited between a pair of discharge electrodes and then output, and includes a laser apparatus, a transfer mask, an introducing optical system, a projection optical system, and a divergence angle adjusting optical system. The laser apparatus outputs the laser beam having a first divergence angle in a discharge direction between the pair of discharge electrodes larger than a second divergence angle in a direction perpendicular to the discharge direction and a traveling direction of the laser beam. The transfer mask forms a transfer pattern. The introducing optical system is for guiding the laser beam to the transfer mask. The projection optical system images the transfer pattern on the resin layer. The divergence angle adjusting optical system is disposed on an optical path of the laser beam and adjusts a difference between the first divergence angle and the second divergence angle to be reduced.

A laser processing method according to one aspect of the present disclosure is for forming a hole in a workpiece having a resin layer disposed on a processing surface by irradiating the workpiece with a laser beam discharge-excited between a pair of discharge electrodes and then output, and includes a workpiece setting step, a transfer positioning step, a laser outputting step, an introducing optical step, a transfer pattern forming step, a transfer imaging step, and a divergence angle adjusting step. The workpiece setting step is for setting the workpiece on which the resin layer is disposed on a table of a moving stage. The transfer positioning step is for performing relative positioning between a transfer position and the workpiece such that the transfer position and a surface of the resin layer coincide. The laser outputting step is for outputting the laser beam, having a first divergence angle in a discharge direction between the pair of discharge electrodes larger than a second divergence angle in a direction perpendicular to the discharge direction and a traveling direction of the laser beam, to the workpiece on which the resin layer is disposed. The introducing optical step is for guiding the laser beam to a transfer mask. The transfer pattern forming step is for forming a transfer pattern. The transfer imaging step is for imaging the transfer pattern on the resin layer. The divergence angle adjusting step is for adjusting a difference between the first divergence angle and the second divergence angle to be reduced.

An electronic device manufacturing method according to one aspect of the present disclosure includes a first coupling step and a second coupling step. The first coupling step is for coupling and electrically connecting an interposer and an integrated circuit chip to each other. The second coupling step is for coupling and electrically connecting the interposer and a circuit board to each other. The interposer includes an insulating substrate in which a plurality of through-holes are formed and conductors provided in the through-holes, and the through-holes are formed by a laser processing method of forming a hole at each irradiation position of a plurality of laser beams with which the insulating substrate having a processing surface with a resin layer disposed thereon is irradiated. The laser processing method includes generating the laser beam having a first divergence angle in a discharge direction between a pair of discharge electrodes larger than a second divergence angle in a direction perpendicular to the discharge direction and a traveling direction of the laser beam, reducing a difference between the first divergence angle and the second divergence angle of the laser beam, and then imaging the laser beam on the resin layer to form the through-holes in the insulating substrate.

BRIEF DESCRIPTION OF THE DRAWINGS

Some embodiments of the present disclosure will be described below, by way of example only, with reference to the accompanying drawings.

DESCRIPTION OF EMBODIMENTS

Contents

Figure 1:
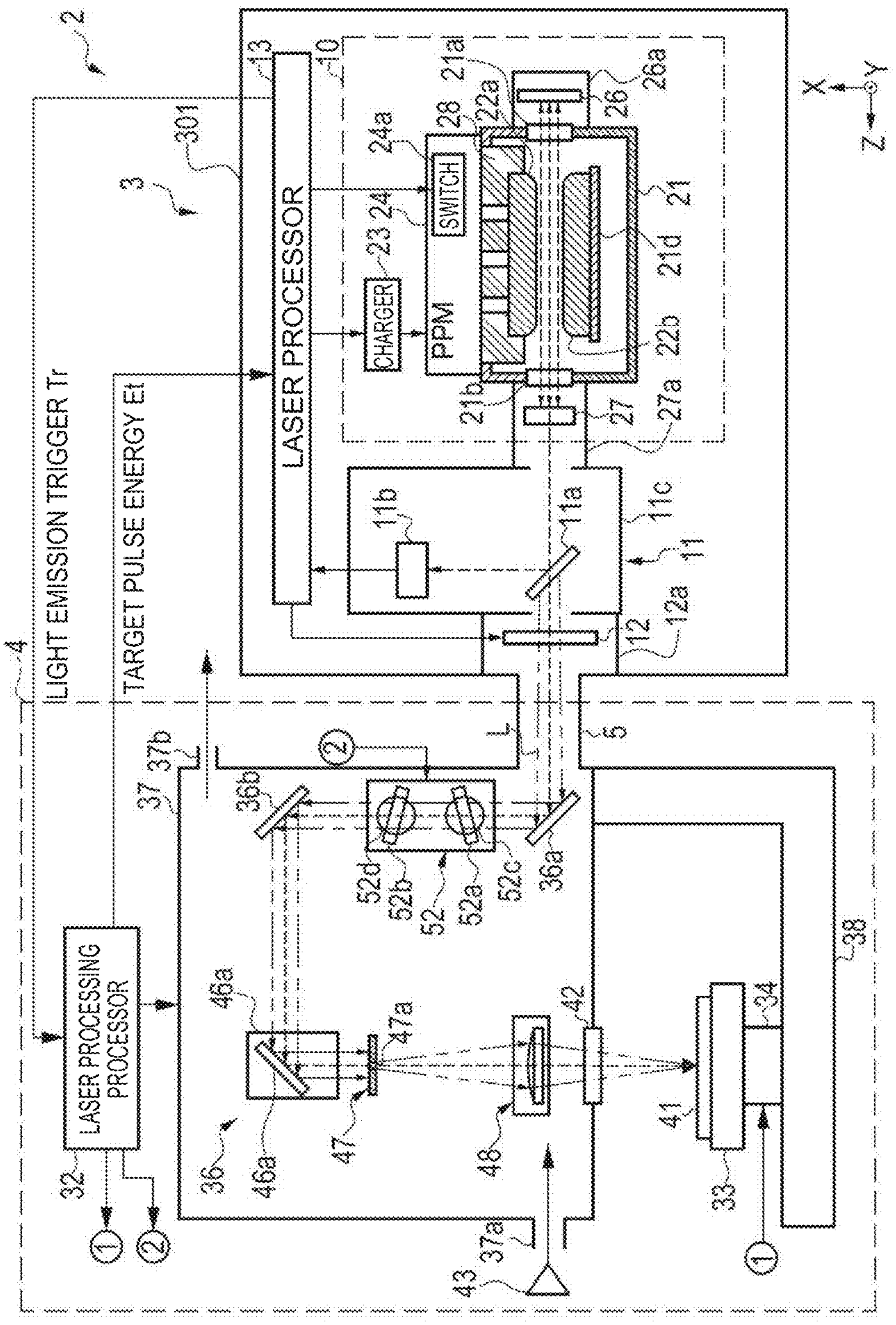
FIG. 1 schematically illustrates a configuration of a laser processing apparatus according to a comparative example.

1. Comparative Example
  1.1 Configuration
  1.2 Operation
  1.3 Problem
2. First Embodiment 2.1 Configuration
2.2 Operation
2.3 Operation and Effects
2.4 Modifications of NA adjusting aperture
3. Second Embodiment
3.1 Configuration
3.2 Operation
3.3 Operation and Effects
4. Modification of laser processing apparatus
4.1 Configuration
4.2 Operation
4.3 Operation and Effects
5. Electronic device manufacturing method using laser processing apparatus according to present disclosure Hereinafter, embodiments of the present disclosure will be described in detail with reference to the drawings. The embodiments described below show some examples of the present disclosure and do not limit contents of the present disclosure. In addition, all configurations and operations described in the embodiments are not necessarily essential as configurations and operations of the present disclosure. Here, the same components are denoted by the same reference numerals, and any redundant description thereof is omitted.

1. Comparative Example

1.1 Configuration

FIG. 1 schematically illustrates a configuration of a laser processing apparatus 2 according to a comparative example. The comparative example is an example recognized by the applicant as known only by the applicant, and is not a publicly known example admitted by the applicant.

The laser processing apparatus 2 mainly includes a laser apparatus 3, an optical path pipe 5, and a laser processing apparatus main body 4. The laser apparatus 3 and the laser processing apparatus main body 4 are connected by the optical path pipe 5. Hereinafter, a direction parallel to an optical axis direction of a laser beam entering a workpiece 41 will be described as an X direction, a direction orthogonal to the X direction will be described as a Z direction, and a direction orthogonal to the X direction and the Z direction will be described as a Y direction. The X direction corresponds to a height direction of the workpiece 41.

The laser apparatus 3 mainly includes a housing 301, and a laser oscillator 10, a monitor module 11, a shutter 12 and a laser processor 13 which are disposed in an internal space of the housing 301. The laser apparatus 3 is an ArF excimer laser apparatus using a mixed gas containing argon (Ar), fluorine ($F_2$) and neon (Ne) as laser media. The laser apparatus 3 outputs a laser beam having a center wavelength of about 193.4 nm.

Note that the laser apparatus 3 may be a laser apparatus other than the ArF excimer laser apparatus, and may be, for example, a KrF excimer laser apparatus using a mixed gas containing krypton (Kr), $F_2$, and Ne. In this case, the laser apparatus 3 outputs a laser beam having the center wavelength of about 248.0 nm. The mixed gas containing Ar, $F_2$, and Ne, which are the laser media, and the mixed gas containing Kr, $F_2$, and Ne, which are the laser media, are referred to as a laser gas hereinafter.

The laser oscillator 10 includes a laser chamber 21, a charger 23, a pulse power module (PPM) 24, a rear mirror 26, and an output coupling mirror 27. FIG. 1 illustrates an internal configuration of the laser chamber 21 as viewed from a direction substantially perpendicular to a traveling direction of the laser beam.

The laser chamber 21 includes an internal space where light is generated by excitation of the laser medium in the laser gas. The laser gas is supplied from an unillustrated laser gas supply source to the internal space of the laser chamber 21 via an unillustrated pipe. The light generated by the excitation of the laser medium travels to windows 21*a* and 21*b* to be described later.

In the internal space of the laser chamber 21, a pair of electrodes 22*a* and 22*b* are disposed so as to face each other and to have a longitudinal direction along the traveling direction of the light. The pair of electrodes 22*a* and 22*b* are discharge electrodes for exciting the laser medium by glow discharge. In the present example, the electrode 22*a* is a cathode and the electrode 22*b* is an anode.

The electrode 22*a* is supported by an electrically insulating part 28. An opening is formed on the laser chamber 21, and the electrically insulating part 28 closes the opening. A conductive part is embedded in the electrically insulating part 28. The conductive part applies a high voltage supplied from the pulse power module 24 to the electrode 22*a*. The electrode 22*b* is supported by a return plate 21*d*. The return plate 21*d* is connected to an inner surface of the laser chamber 21 by an unillustrated wire.

The charger 23 is a DC power supply device that charges an unillustrated charging capacitor in the pulse power module 24 with a predetermined voltage. The pulse power module 24 includes a switch 24*a* controlled by the laser processor 13. When the switch 24*a* is turned from OFF to ON, the pulse power module 24 generates a pulsed high voltage from electric energy held in the charger 23 and applies the pulsed high voltage between the pair of electrodes 22*a* and 22*b*.

When the high voltage is applied between the electrode 22*a* and the electrode 22*b*, discharge occurs between the electrode 22*a* and the electrode 22*b*. The laser medium in the laser chamber 21 is excited by the energy of the discharge. The laser beam is output when the excited laser medium shifts to a ground state. Discharge surfaces of the pair of electrodes 22*a* and 22*b* each have a rectangular shape. The electrode 22*a* and the electrode 22*b* are disposed such that the discharge surface of the electrode 22*a* and the discharge surface of the electrode 22*b* face each other in the X direction.

The windows 21*a* and 21*b* are provided at both ends of the laser chamber 21. The window 21*a* is positioned at one end side in the traveling direction of the laser beam, and the window 21*b* is positioned at the other end side. The laser beam oscillated as described later is output to the outside of the laser chamber 21 through the windows 21*a* and 21*b*. The laser beam is a pulse laser beam because it is generated by applying the pulsed high voltage between the electrode 22*a* and the electrode 22*b* by the pulse power module 24.

The rear mirror 26 is disposed in the internal space of a housing 26*a* connected to one end of the laser chamber 21, reflects the light output from the window 21*a* of the laser chamber 21 at a high reflectance, and returns the light to the laser chamber 21. The output coupling mirror 27 is disposed in the internal space of an optical path pipe 27*a* connected to the other end of the laser chamber 21, transmits and outputs a part of the light output from the window 21*b* of the laser chamber 21, and reflects the other part back into the laser chamber 21.

The rear mirror 26 and the output coupling mirror 27 configures a Fabry-Perot laser resonator, and the laser chamber 21 is disposed on an optical path of the laser resonator. The light output from the laser chamber 21 reciprocates between the rear mirror 26 and the output coupling mirror 27, and is amplified every time the light passes through a laser gain space between the electrode 22*a* and the electrode 22*b*. A part of the amplified light is output as the laser beam via the output coupling mirror 27.

The monitor module 11 is disposed on the optical path of the laser beam output from the output coupling mirror 27. The monitor module 11 includes a housing 11*c*, a beam splitter 11*a*, and a photosensor 11*b*. An opening is formed on the housing 11*c*, and an internal space of the housing 11*c* communicates with the internal space of the optical path pipe 27*a* through the opening. The beam splitter 11*a* and the photosensor 11*b* are disposed in the internal space of the housing 11*c*.

The beam splitter 11*a* transmits the laser beam output from the output coupling mirror 27 toward the shutter 12 with a high transmittance, and reflects a part of the laser beam toward a light receiving surface of the photosensor 11*b*. The photosensor 11*b* measures pulse energy E of the laser beam which is made incident on the light receiving surface. The photosensor 11*b* is electrically connected to the laser processor 13, and outputs data of the measured pulse energy E to the laser processor 13.

The laser processor 13 of the present disclosure is a processing device including a storage device in which an unillustrated control program is stored and a CPU (central processing unit) which executes the control program. The laser processor 13 controls the entire laser apparatus 3.

The laser processor 13 receives the data of the pulse energy E from the photosensor 11*b* of the monitor module 11. The laser processor 13 transmits and receives various signals to and from a laser processing processor 32. For example, the laser processor 13 receives, from the laser processing processor 32, data of a light emission trigger Tr and target pulse energy Et, and the like. Further, the laser processor 13 transmits a charging voltage setting signal to the charger 23, and transmits a command signal for ON or OFF of the switch 24*a* to the pulse power module 24.

The laser processor 13 receives the data of the pulse energy E from the monitor module 11, and controls a charging voltage of the charger 23 with reference to the received data. By the laser processor 13 controlling the charging voltage of the charger 23, the energy of the laser beam is controlled.

The shutter 12 is disposed on the optical path of the laser beam transmitted through the beam splitter 11*a* in an internal space of an optical path pipe 12*a* connected to the housing 11*c* of the monitor module 11. The optical path pipe 12*a* is connected to a side of the housing 11*c* opposite to a side to which the optical path pipe 27*a* is connected. The internal space of the optical path pipe 12*a* communicates with the internal space of the housing 11*c* via the opening formed on the housing 11*c*. The optical path pipe 12*a* communicates with the optical path pipe 5 via an opening formed on the housing 301.

The shutter 12 is electrically connected to the laser processor 13. After laser oscillation is started, the laser processor 13 controls the shutter 12 to close until a difference between the pulse energy E received from the monitor module 11 and the target pulse energy Et settles within an allowable range. The laser processor 13 controls the shutter 12 to open when the difference between the pulse energy E received from the monitor module 11 and the target pulse energy Et settles within the allowable range. The laser processor 13 transmits a signal indicating that the light emission trigger Tr of the laser beam has become acceptable to the laser processing processor 32 of the laser processing apparatus main body 4 in synchronization with an opening/closing signal of the shutter 12. The light emission trigger Tr is defined by a predetermined repetition frequency f of the laser beam and a predetermined pulse count P, and is a timing signal for causing the laser processing processor 32 to make the laser oscillator 10 perform the laser oscillation. The repetition frequency f of the laser beam is, for example, within a range equal to or higher than 1 kHz and equal to or lower than 10 kHz.

The internal spaces of the optical path pipe 12*a* and the optical path pipe 27*a* and the internal spaces of the housing 11*c* and the housing 26*a* are filled with a purge gas. The purge gas contains an inert gas such as high purity nitrogen. The purge gas is supplied from an unillustrated purge gas supply source to the internal spaces of the optical path pipe 12*a* and the optical path pipe 27*a* and the internal spaces of the housing 11*c* and the housing 26*a* through an unillustrated pipe.

An unillustrated exhaust device for exhausting the laser gas exhausted from the internal space of the laser chamber 21 is disposed in the internal space of the laser apparatus 3. The exhaust device performs, for example, a process of removing an $F_2$ gas from the gas exhausted from the internal space of the laser chamber 21 by a halogen filter, and releases the gas to the housing 301 of the laser apparatus 3.

The laser beam passes through the shutter 12 while the shutter 12 is open, and is output from the optical path pipe 12*a* of the laser apparatus 3. Hereinafter, the laser beam output from the laser apparatus 3 is referred to as a laser beam L.

The laser processing apparatus main body 4 includes the laser processing processor 32, a table 33, a moving stage 34, an optical device 36, a housing 37, and a frame 38. The optical device 36 is disposed in the housing 37. The housing 37 and the moving stage 34 are fixed to the frame 38.

The table 33 supports the workpiece 41. The workpiece 41 is a processing object to which laser processing is performed by being irradiated with the laser beam L. The workpiece 41 is formed of a material transparent to the ultraviolet laser beam L, for example, synthetic quartz glass. In the present comparative example, the laser processing is drilling processing of making a hole in the workpiece 41.

The moving stage 34 supports the table 33. The moving stage 34 is movable in the X direction, the Y direction, and the Z direction, and a position of the workpiece 41 can be adjusted by adjusting the position of the table 33. Under control of the laser processing processor 32, the moving stage 34 adjusts the position of the workpiece 41 so that a desired processing position is irradiated with the laser beam L output from the optical device 36.

The laser processing apparatus 2 performs, for example, the drilling processing at one or more positions of the workpiece 41. Position data indicating a processing position is sequentially set in the laser processing processor 32. The position data is, for example, coordinate data defining respective positions in the X direction, the Y direction, and the Z direction of each processing position with reference to an origin position of the moving stage 34. The laser processing processor 32 controls a moving amount of the moving stage 34 based on the coordinate data to position the workpiece 41 on the moving stage 34.

The optical device 36 includes, for example, high reflective mirrors 36*a* and 36*b*, an attenuator 52, an introducing optical system 46, a transfer mask 47, and a projection optical system 48, and transfers an image corresponding to a processing shape onto a surface of the workpiece 41. The high reflective mirrors 36*a* and 36*b*, the introducing optical system 46, the transfer mask 47, and the projection optical system 48 are fixed to an unillustrated holder respectively, and are disposed at predetermined positions in the housing 37.

The high reflective mirrors 36*a* and 36*b* reflect the laser beam L in an ultraviolet region each at a high reflectance. The high reflective mirror 36*a* reflects the laser beam L input from the laser apparatus 3 toward the high reflective mirror 36*b*. The high reflective mirror 36*b* reflects the laser beam L toward the introducing optical system 46.

The introducing optical system 46 includes a high reflective mirror 46*a*, and is disposed so as to uniformize a light intensity distribution of the laser beam L reflected by the high reflective mirror 36*b* and to Kohler-illuminate the transfer mask 47 with the laser beam L in a rectangular beam shape. The high reflective mirror 46*a* is a transparent substrate formed of, for example, synthetic quartz or calcium fluoride, and a surface of the high reflective mirror 46*a* is coated with a reflective film that highly reflects the laser beam L.

The transfer mask 47 is disposed on an optical path between the introducing optical system 46 and the projection optical system 48. The transfer mask 47 allows a part of the laser beam L output from the introducing optical system 46 to pass therethrough, thereby forming the image corresponding to the processing shape to the workpiece 41. The transfer mask 47 is, for example, a light shielding plate having a light shielding property for shielding the laser beam L, and a transmission hole corresponding to a shape of a transfer pattern is formed. In the present example, the transfer pattern is a circular pattern, and the transmission hole is a circular pinhole 47*a*.

By using such a transfer mask 47, the laser processing apparatus main body 4 of the present example performs the drilling processing of forming a hole having a circular cross section on the workpiece 41.

The projection optical system 48 condenses the incident laser beam L and outputs the laser beam L toward the workpiece 41 through a window 42. The projection optical system 48 configures a transfer optical system that forms a transfer image generated by the laser beam L passing through the transfer mask 47 at a position corresponding to a focal length of the projection optical system 48. Hereinafter, an imaging position at which the transfer image is formed by an effect of the projection optical system 48 is referred to as a transfer position.

The transfer position is set at a position coinciding with a surface on an incident side where the laser beam L enters in the X direction. Hereinafter, simply a surface of the workpiece 41 means the surface on the incident side of the workpiece 41.

The projection optical system 48 is configured by, for example, a combination of a plurality of lenses. The projection optical system 48 is a reduction optical system that forms the transfer image smaller than an actual size of the pinhole 47*a* formed in the transfer mask 47 at the transfer position. Magnification M of the transfer optical system configured by the projection optical system 48 is, for example, 1/10 to 1/5. The projection optical system 48 may be configured by a single lens.

The window 42 is disposed on an optical path between the projection optical system 48 and the workpiece 41, and is fixed in a state of being sealed by an unillustrated O-ring to an opening formed on the housing 37.

The attenuator 52 is disposed on an optical path between the high reflective mirror 36*a* and the high reflective mirror 36*b* in the housing 37. The attenuator 52 includes, for example, two partial reflection mirrors 52*a* and 52*b* and rotating stages 52*c* and 52*d* of the partial reflection mirrors. The two partial reflection mirrors 52*a* and 52*b* are optical elements the transmittance of which changes according to an incident angle of the laser beam L. Tilt angles of the partial reflection mirror 52*a* and the partial reflection mirror 52*b* are adjusted by the rotating stage 52*c* and the rotating stage 52*d* so that the incident angle of the laser beam L coincides with each other and the desired transmittance is obtained.

Accordingly, the laser beam L is attenuated to desired energy and passes through the attenuator 52. A transmittance T of the attenuator 52 is controlled based on a control signal of the laser processing processor 32. In addition to controlling a fluence of the laser beam L output by the laser apparatus 3 through the target pulse energy Et, the laser processing processor 32 controls the fluence of the laser beam L by controlling the transmittance T of the attenuator 52.

While the laser processing apparatus 2 is operated, a nitrogen ($N_2$) gas, which is the inert gas, always flows inside the housing 37. The housing 37 is provided with a suction port 37*a* for sucking the nitrogen gas into the housing 37 and an exhaust port 37*b* for discharging the nitrogen gas from the housing 37 to the outside. A suction pipe and an exhaust pipe which are not illustrated can be connected to the suction port 37*a* and the exhaust port 37*b*. A nitrogen gas supply source 43 is connected to the suction port 37*a*.

1.2 Operation

An operation of the laser processing apparatus 2 will be described with reference to FIG. 2 and FIG. 3.

Figure 2:
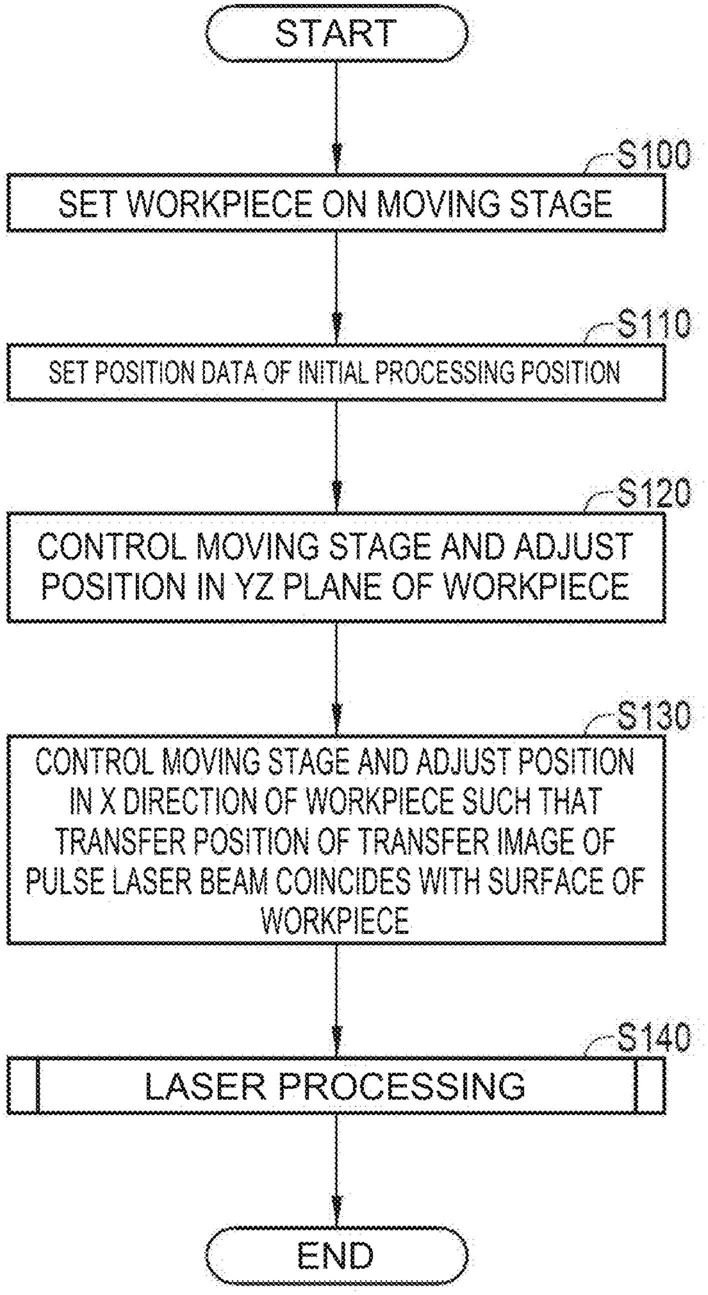
FIG. 2 is a flowchart illustrating a laser processing procedure.

As illustrated in FIG. 2, when performing the laser processing, the workpiece 41 is set on the table 33 of the moving stage 34 (S100). The laser processing processor 32 sets the position data of an initial processing position to the moving stage 34 (S110).

The laser processing processor 32 controls the moving stage 34 and adjusts a position in a YZ plane of the workpiece 41 (S120). In S120, the laser processing processor 32 adjusts the position of the workpiece 41 in the YZ plane by controlling a moving amount of the moving stage 34 based on the coordinate data in the YZ plane included in the position data. As a result, positioning of the workpiece 41 in the YZ plane is performed.

Next, the laser processing processor 32 controls the moving stage 34 and adjusts a position of the workpiece 41 in the X direction so that the transfer position of the transfer image of the laser beam L coincides with the surface of the workpiece 41 (S130). Specifically, in the position data, the position of the workpiece 41 in the X direction is defined such that the transfer position of the transfer image of the laser beam L coincides with the surface of the workpiece 41. The transfer position of the transfer image is determined according to a distance between the transfer mask 47 and the projection optical system 48, the focal length of the projection optical system 48, and the like.

In S130, the laser processing processor 32 adjusts the position of the workpiece 41 in the X direction by controlling the moving amount of the moving stage 34 based on the position data. Thus, in the X direction, the transfer position and the workpiece 41 are relatively positioned so that the transfer position and the surface of the workpiece 41 coincide with each other. Since the X direction is parallel to the optical axis direction of the laser beam L entering the workpiece 41, the positioning in the X direction corresponds to the positioning regarding the optical axis direction of the laser beam L.

After the positioning of the workpiece 41 is completed, the laser processing is performed (S140).

Figure 3:
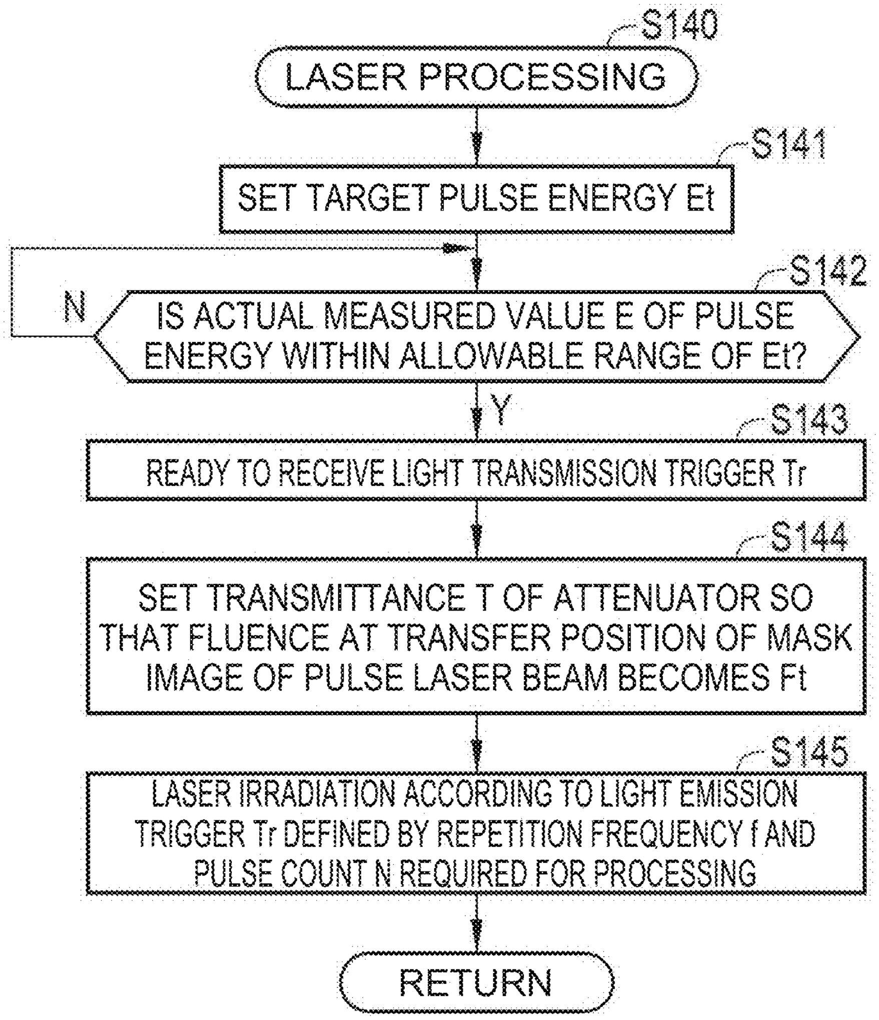
FIG. 3 is a flowchart illustrating a procedure of laser processing.

The laser processing is performed according to a flowchart illustrated in FIG. 3. The laser processing processor 32 controls the energy so that the laser beam L on the surface of the workpiece 41, which is the transfer position of the transfer image, becomes a target fluence Ft. Specifically, the laser processing processor 32 controls the energy entering the workpiece 41 through the control of the target pulse energy Et and the transmittance T of the attenuator 52. Further, the laser processing processor 32 transmits the target pulse energy Et to the laser processor 13 of the laser apparatus 3. Accordingly, the target pulse energy Et is set in the laser processor 13 (S141).

Here, the target fluence Ft is the fluence required for the laser processing, and is an energy density of the laser beam L at the transfer position of the transfer image of the laser beam L. When optical loss of the optical device 36 is negligible, the target fluence Ft is defined by Equation (1) below.

$$Ft = M^{-2}(T \cdot Et) / S_{IL} [mJ / \text{cm}^2] \quad (1)$$

Here, $S_{IL}$ is beam area of the laser beam L which Kohler illuminates the transfer mask 47.

The workpiece 41 is irradiated only with a component passing through the pinhole 47*a*, which is the transfer pattern, of the laser beam L with which the transfer mask 47 is irradiated, thereby contributing to the fluence. In a case where the projection optical system 48 is the reduction optical system as in the present example, the fluence increases as a value of the magnification M decreases, that is, as the image is reduced.

Upon receiving the target pulse energy Et from the laser processing processor 32, the laser processor 13 closes the shutter 12 and activates the charger 23. Then, the laser processor 13 turns ON the switch 24*a* of the pulse power module 24 by an unillustrated internal trigger. Accordingly, the laser oscillator 10 performs the laser oscillation.

The monitor module 11 samples the laser beam L output from the laser oscillator 10 and measures the pulse energy E, which is an actual measured value of the energy. The laser processor 13 controls the charging voltage of the charger 23 so that a difference ΔE between the pulse energy E and the target pulse energy Et approaches 0. Specifically, the laser processor 13 controls the charging voltage so that the difference ΔE is within the allowable range (S142).

The laser processor 13 monitors whether the difference ΔE is within the allowable range (S142). When the difference ΔE is within the allowable range (Y in S142), the laser processor 13 transmits a reception ready signal indicating that the light emission trigger Tr is ready to be received to the laser processing processor 32, and opens the shutter 12. As a result, the laser apparatus 3 becomes ready to receive the light emission trigger Tr (S143).

When receiving the reception ready signal, the laser processing processor 32 sets the transmittance T of the attenuator 52 so that the fluence at the transfer position of the transfer image of the laser beam L becomes the target fluence Ft (S144).

The transmittance T of the attenuator 52 is obtained by Equation (2) below from Equation (1) when there is no optical loss of the optical device 36.

$$T = (Ft / Et) S_{IL} \cdot M^2 \quad (2)$$

After setting the transmittance T of the attenuator 52, the laser processing processor 32 transmits the light emission trigger Tr defined by the predetermined repetition frequency f and a predetermined pulse count N to the laser processor 13 (S145). As a result, in synchronization with the light emission trigger Tr, the laser beam L transmitted through the beam splitter 11*a* of the monitor module 11 is output from the laser apparatus 3 and enters the laser processing apparatus main body 4.

The laser beam L which has entered the laser processing apparatus main body 4 is attenuated in the attenuator 52 through the high reflective mirror 36*a*. The laser beam L having passed through the attenuator 52 is reflected by the high reflective mirror 36*b* and enters the introducing optical system 46. The light intensity is spatially uniformized in the introducing optical system 46, and the laser beam L Kohler-illuminates the transfer mask 47 in the rectangular beam shape.

Of the laser beam L with which the transfer mask 47 is irradiated, the laser beam L having passed through the pinhole 47*a* enters the projection optical system 48. By the projection optical system 48, the reduced transfer image is transferred to the surface of the workpiece 41 through the window 42. Such laser irradiation with the laser beam L is performed according to the light emission trigger Tr defined by the repetition frequency f and the pulse count N required for the laser processing (S145). By the laser irradiation, a circular hole is formed in the workpiece 41.

1.3 Problem

For circuit boards widely used in various kinds of electronic equipment, miniaturization and densification of circuit wiring are required in order to realize size reduction and high functionality of the electronic equipment. Further, the miniaturization and densification of the circuit wiring are required in order to realize a high-quality circuit board as well. In order to realize the miniaturization and densification of the circuit wiring, for example, in a case of forming a hole extending completely through an insulating layer connecting conductor layers in the circuit board, a drilling processing technique capable of suppressing bulging and cracking around the hole is required. Hereinafter, the hole extending completely through the workpiece 41 is referred to as a through-hole.

The laser beam L output from the laser apparatus 3 is not a parallel beam, but a divergent beam diverging with a spread. The divergence angle is different between the X direction, which is a discharge direction, and the Y direction, which is the direction orthogonal to the discharge direction. A difference in the divergence angle depends on an aspect ratio of a rectangular discharge space viewed from the Z direction. In the laser apparatus 3, since a distance between the electrode 22*a* and the electrode 22*b* is longer than a width of the electrodes 22*a* and 22*b*, the discharge space is longer in the X direction than in the Y direction. Therefore, the laser beam L output from the laser apparatus 3 has a larger divergence angle in the X direction than that in the Y direction. Hereinafter, the divergence angle in the X direction is referred to as a first divergence angle θ1, and the divergence angle in the Y direction is referred to as a second divergence angle θ2.

Figure 4:
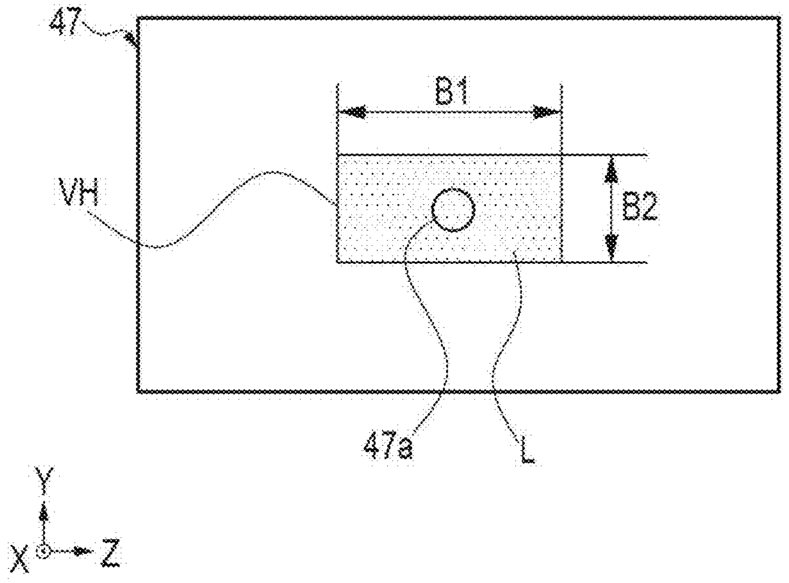
FIG. 4 illustrates a beam shape of a laser beam with which a transfer mask is irradiated.
Figure 5:
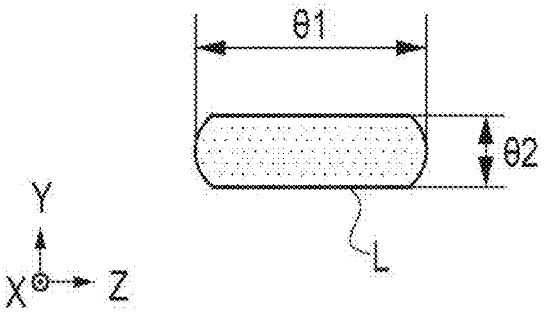
FIG. 5 illustrates an example of a first divergence angle and a second divergence angle of the laser beam with which the transfer mask is irradiated.

FIG. 4 illustrates an example of the beam shape of the laser beam L with which the transfer mask 47 is irradiated. FIG. 5 illustrates an example of the first divergence angle θ1 and the second divergence angle θ2 of the laser beam L with which the transfer mask 47 is irradiated.

In the laser processing apparatus 2, the laser beam L reflected by the high reflective mirror 36*b* is reflected by the high reflective mirror 46*c* of the introducing optical system 46, and enters the transfer mask 47 in a rectangular (B1×B2) beam shape as illustrated in FIG. 4. As illustrated in FIG. 5, the laser beam L with which the transfer mask 47 is irradiated travels while keeping the difference between the first divergence angle θ1 and the second divergence angle θ2.

In the transfer mask 47, the first divergence angle θ1 corresponds to the divergence angle in the Z direction, and the second divergence angle θ2 corresponds to the divergence angle in the Y direction. Hereinafter, the difference between the first divergence angle θ1 and the second divergence angle θ2 is referred to as an NA (numerical aperture) difference.

Figure 6:
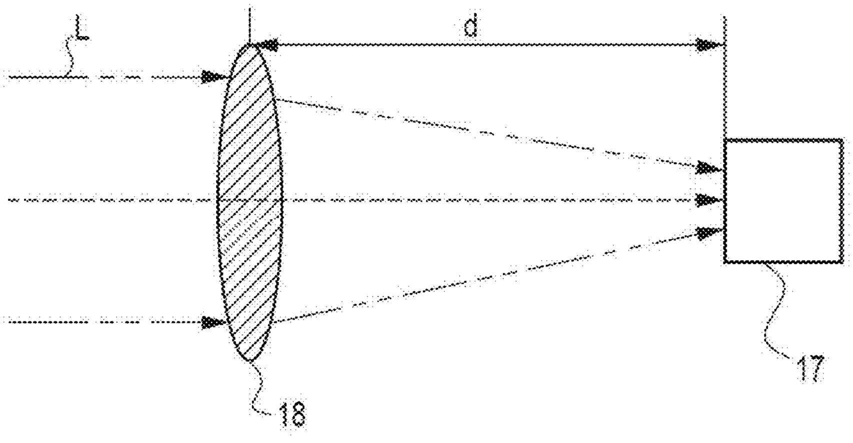
FIG. 6 illustrates an example of a method of measuring a divergence angle of the laser beam.

FIG. 6 illustrates an example of a method of measuring the divergence angle of the laser beam L. For example, as illustrated in FIG. 6, the laser beam L output from the laser apparatus 3 is imaged at a two-dimensional image sensor 17 via a lens 18. By measuring a size of the image of the laser beam L formed at the two-dimensional image sensor 17 and dividing it by a distance d between the lens 18 and the two-dimensional image sensor 17, the first divergence angle θ1 and the second divergence angle θ2 can be measured.

Figure 7:
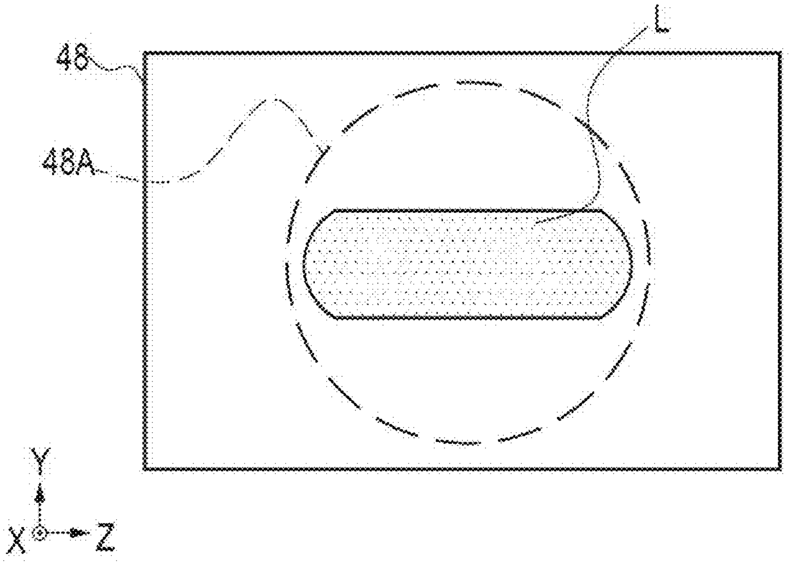
FIG. 7 illustrates a relationship between the beam shape of the laser beam which passes through the transfer mask and enters a projection optical system and an effective projection area.

FIG. 7 illustrates a relationship between the beam shape of the laser beam L which passes through the transfer mask 47 and enters the projection optical system 48 and an effective area 48A of the projection optical system 48. The laser beam L having passed through the transfer mask 47 forms an irradiation pattern, but enters the projection optical system 48 keeping the NA difference as illustrated in FIG. 7. The surface of the workpiece 41 is irradiated with the laser beam L having passed through the projection optical system 48 keeping the NA difference. That is, when viewed from the workpiece 41, the surface is irradiated with the laser beam L having the NA difference, ablation occurs and thus fine holes are formed. Hereinafter, the hole formed in the workpiece 41 is referred to as a processed hole.

Figure 8:
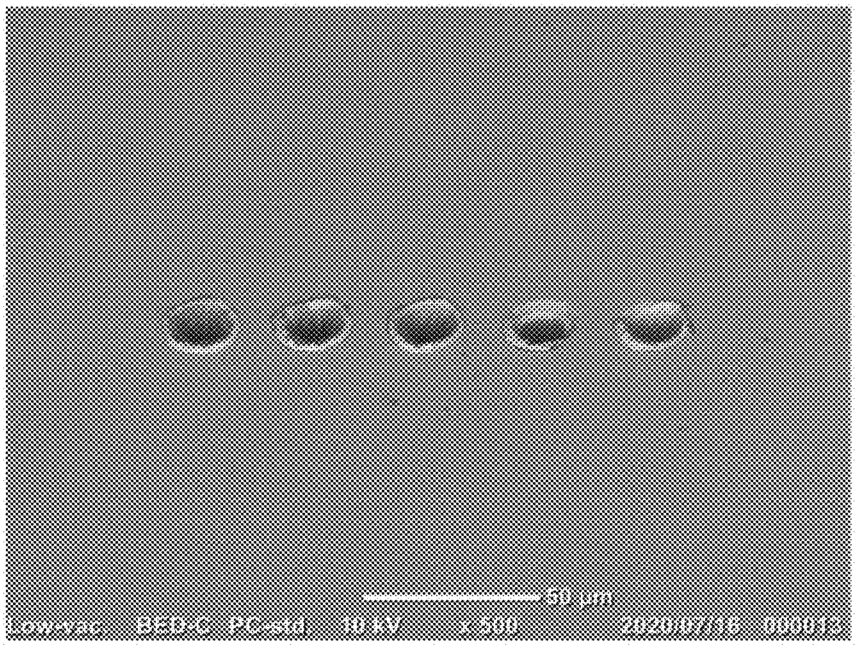
FIG. 8 is a photograph illustrating a state where bulging is caused around a processed hole by drilling processing by the laser processing apparatus according to the comparative example.
Figure 9:
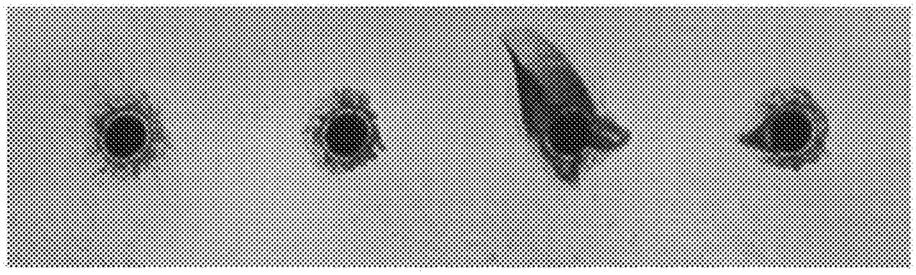
FIG. 9 is a photograph illustrating a state where cracking is caused by the drilling processing by the laser processing apparatus according to the comparative example.

The present applicant has found that there is a problem in that, when drilling processing is performed with the laser beam L having the NA difference, bulging and cracking occur around the processed hole of the workpiece 41. FIG. 8 is an SEM (scanning electron microscope) photograph illustrating a state where bulging is caused around the processed hole by the drilling processing by the laser processing apparatus 2 according to the comparative example. As illustrated in FIG. 8, when the workpiece 41 is drilled with the laser beam L having the NA difference, a periphery of the processed hole is covered with a processing residue, thereby causing bulging. FIG. 9 is an SEM photograph illustrating a state where cracking is caused by the drilling processing performed by the laser processing apparatus 2 according to the comparative example. As illustrated in FIG. 9, when the workpiece 41 is drilled with the laser beam L having the NA difference, cracking occurs around the processed hole.

Figure 10:
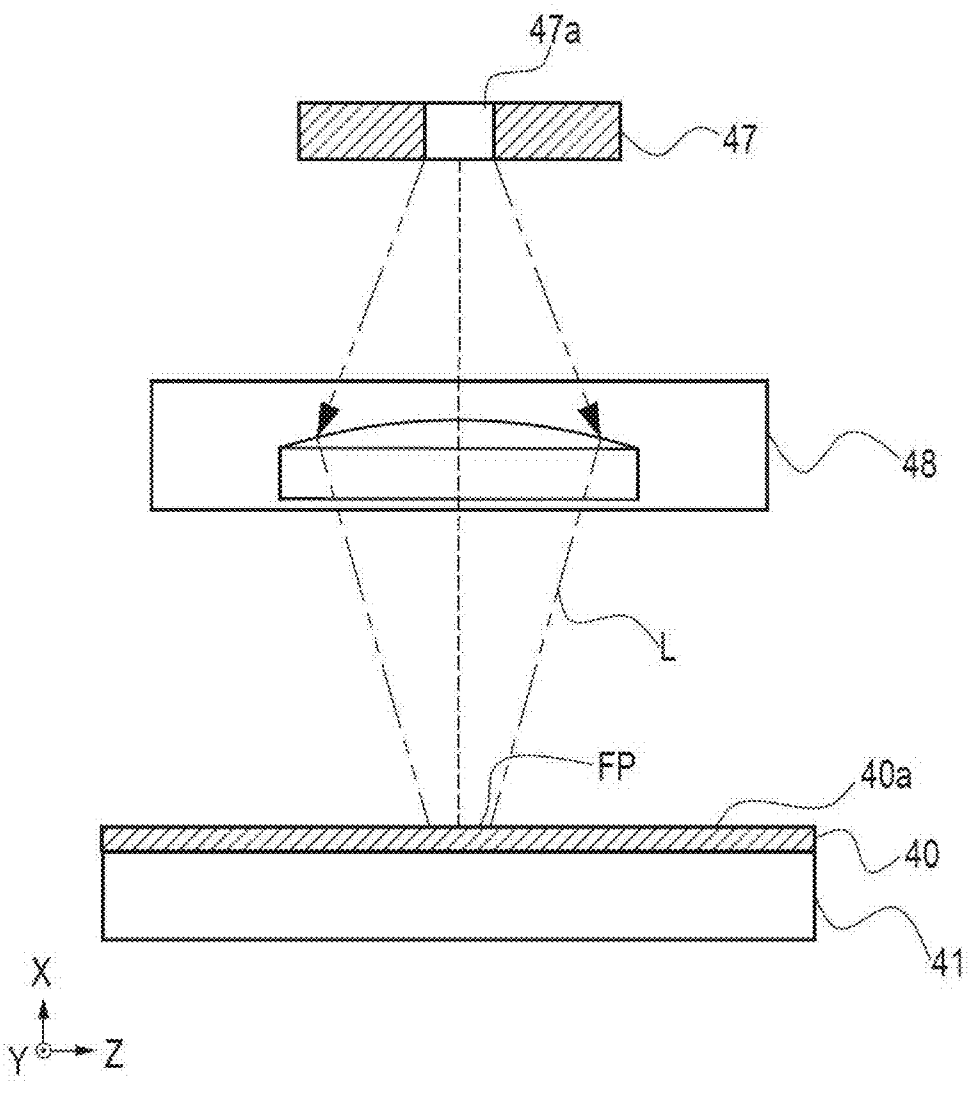
FIG. 10 illustrates an example of forming a through-hole in a workpiece having a resin film disposed on a surface using the laser processing apparatus according to the comparative example.

In order to solve the problem, it is conceivable to dispose a resin film 40 as a protective material on the surface of the workpiece 41. FIG. 10 illustrates an example of forming a through-hole in the workpiece 41 having the resin film 40 disposed on the surface using the laser processing apparatus 2 according to the comparative example. As illustrated in FIG. 10, the resin film 40 was disposed on the surface of the workpiece 41 and the drilling processing was performed. Specifically, in order to suppress cracking, the fluence and a beam diameter at the position where a transfer position FP of the transfer image of the laser beam L and a surface 40*a* of the resin film 40 coincide with each other were adjusted and the drilling processing was performed. However, the problem of bulging and cracking was not improved.

Figure 11:
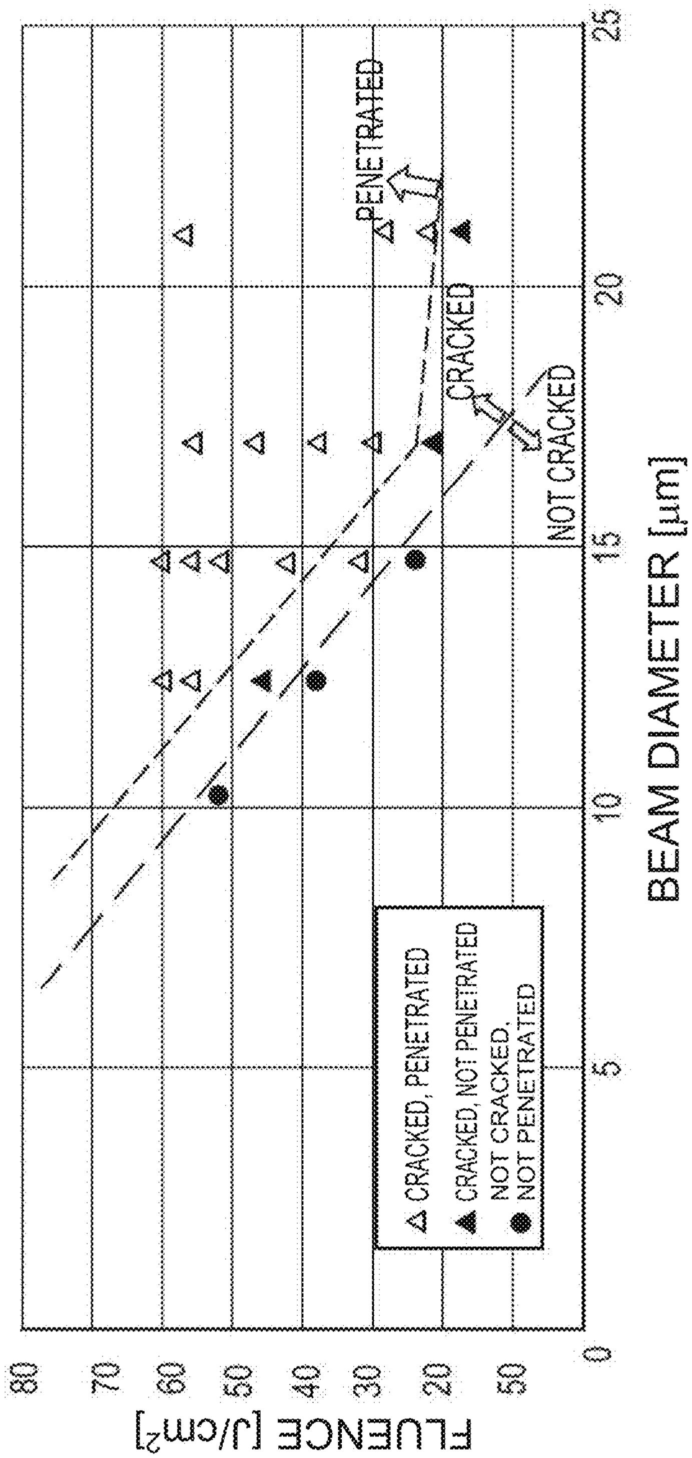
FIG. 11 is a graph illustrating a relationship between a fluence and a beam diameter in the drilling processing illustrated in FIG. 10.

FIG. 11 is a graph illustrating a relationship between the fluence and the beam diameter in the drilling processing illustrated in FIG. 10. As illustrated in FIG. 11, when the beam diameter was 20.9 μm and the fluence was equal to or larger than 23 J/cm$^2$, penetration of the processed hole was achieved and a through-hole was formed, but cracking occurred. When the beam diameter was 16.7 μm and the fluence was equal to or larger than 30 J/cm$^2$, a through-hole was formed, but cracking occurred. When the beam diameter was 14.6 μm and the fluence was equal to or larger than 42 J/cm$^2$, a through-hole was formed, but cracking occurred. When the beam diameter was 12.5 μm and the fluence was equal to or larger than 55 J/cm$^2$, a through-hole was formed, but cracking occurred. When the beam diameter was 12.5 μm and the fluence was equal to or smaller than 39 J/cm$^2$, cracking did not occur, but penetration of the processed hole was not achieved and a through-hole was not formed. When the beam diameter was 12.5 μm and the fluence was 47 J/cm$^2$, cracking occurred and a through-hole was not formed. When the beam diameter was 10.4 μm and the fluence was equal to or smaller than 52 J/cm$^2$, cracking did not occur, but a through-hole was not formed.

Figure 12:
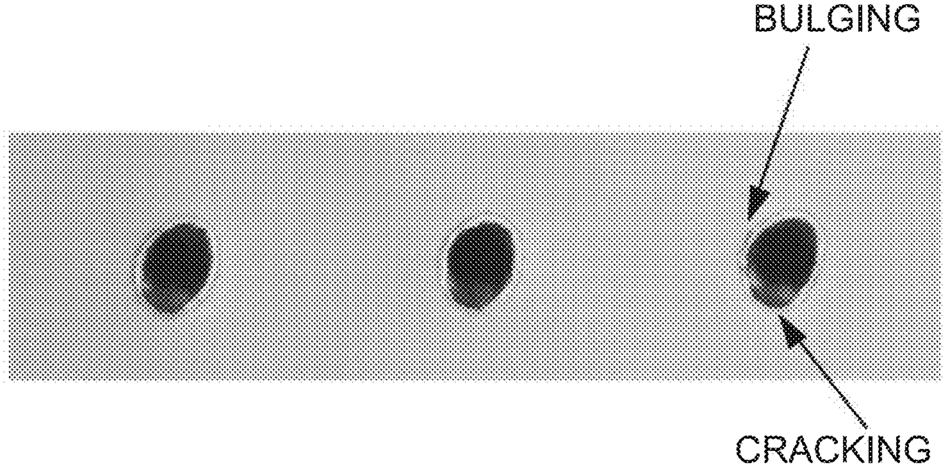
FIG. 12 is a photograph illustrating a result of drilling the workpiece having the resin film disposed thereon using the laser processing apparatus according to the comparative example.

As described above, in the drilling processing for forming a through-hole in the workpiece 41, the problem of cracking could not be solved even when the resin film 40 was disposed on the surface of the workpiece 41. Rather, a new problem arose. That is, at the high fluence, as illustrated in FIG. 12, an undesirable phenomenon occurred in which a shape of the processed hole collapsed in a certain direction and became a substantially elliptical shape. FIG. 12 is an SEM photograph illustrating a result of drilling the workpiece 41 having the resin film 40 disposed thereon using the laser processing apparatus 2 according to the comparative example.

Figure 13:
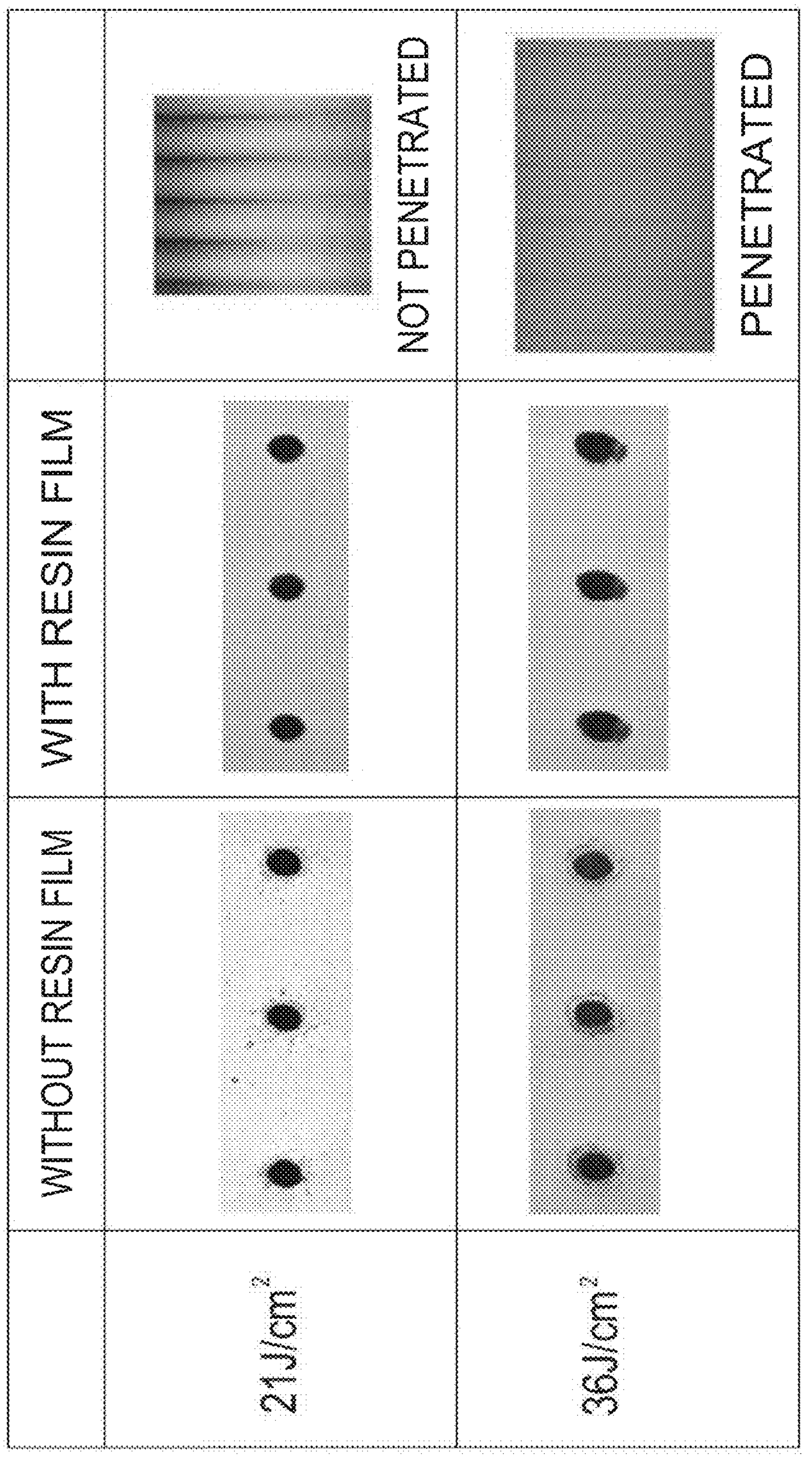
FIG. 13 illustrates a result of drilling the workpiece having no resin film disposed thereon and the result of drilling the workpiece having the resin film disposed thereon.

FIG. 13 illustrates a result of drilling the workpiece 41 having no resin film 40 disposed thereon and the result of drilling the workpiece 41 having the resin film 40 disposed thereon. In the case of the workpiece 41 having no resin film 40 disposed thereon, bulging and cracking occurred regardless of the fluence. In the case of the workpiece 41 having the resin film 40 disposed thereon, for example, at the low fluence of 21 J/cm$^2$, cracking was slightly improved but a through-hole was not formed. Further, in the case of the workpiece 41 having the resin film 40 disposed thereon, for example, at the high fluence of 36 J/cm$^2$, a through-hole was formed but bulging and cracking could not be suppressed.

As described above, in the laser processing apparatus 2 according to the comparative example, bulging and cracking around the processed hole of the workpiece 41 could not be suppressed by adjusting the fluence or the beam diameter.

Therefore, in the following embodiments, a laser processing apparatus and a laser processing method capable of suppressing bulging and cracking around the processed hole of the workpiece 41 will be disclosed.

2. First Embodiment

Next, a laser processing apparatus and a laser processing method of a first embodiment will be described. Any component same as that described above is denoted by an identical reference sign, and any redundant description thereof is omitted unless specific description is needed.

2.1 Configuration

Figure 14:
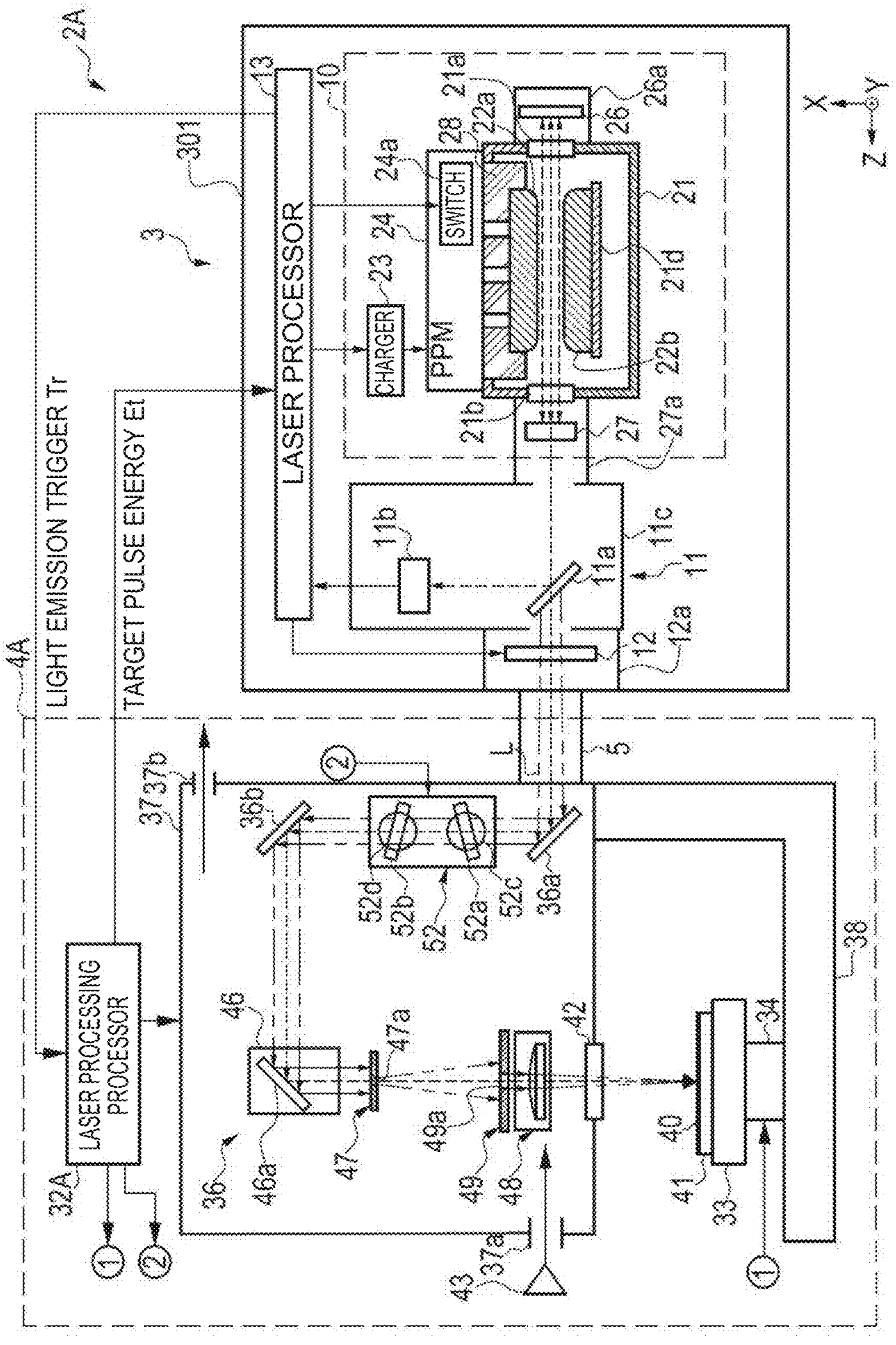
FIG. 14 schematically illustrates a configuration of a laser processing apparatus of a first embodiment.

FIG. 14 schematically illustrates a configuration of a laser processing apparatus 2A according to the first embodiment. The laser processing apparatus 2A of the first embodiment includes a laser processing apparatus main body 4A instead of the laser processing apparatus main body 4 of the laser processing apparatus 2 according to the comparative example described with reference to FIG. 1.

The laser processing apparatus main body 4A of the first embodiment includes an NA adjusting aperture 49, unlike the laser processing apparatus main body 4 of the comparative example. The remaining configuration of the laser processing apparatus main body 4A is the same as that of the laser processing apparatus main body 4 of the comparative example. The NA adjusting aperture 49 is an example of the "divergence angle adjusting optical system" according to the technology of the present disclosure.

The NA adjusting aperture 49 is disposed on the optical path of the laser beam L between the transfer mask 47 and the projection optical system 48. Note that the NA adjusting aperture 49 is not limited to the disposition of the present example. The NA adjusting aperture 49 is only required to be disposed on the optical path of the laser beam L between the transfer mask 47 and the workpiece 41.

Figure 15:
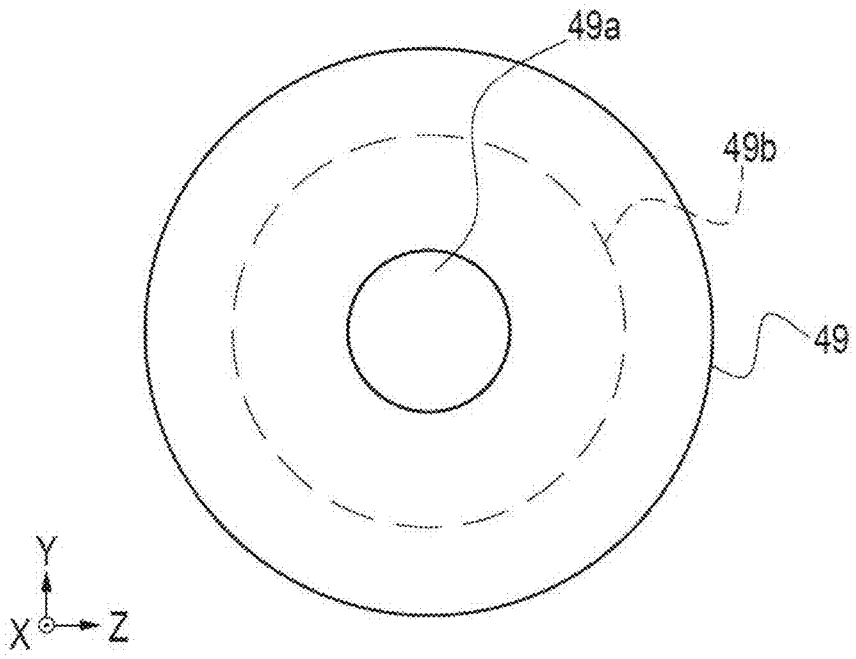
FIG. 15 is a diagram illustrating a configuration of an NA adjusting aperture.

FIG. 15 illustrates an example of a configuration of the NA adjusting aperture 49. As illustrated in FIG. 15, the NA adjusting aperture 49 is formed with a diaphragm hole 49*a* for reducing the NA difference of the laser beam L. The diaphragm hole 49*a* is formed in an effective projection area 49*b* on which the laser beam L having passed through the transfer mask 47 is projected. In the present embodiment, a shape of the diaphragm hole 49*a* is circular. The diaphragm hole 49*a* is an example of an "opening" according to the technology of the present disclosure.

Figure 16:
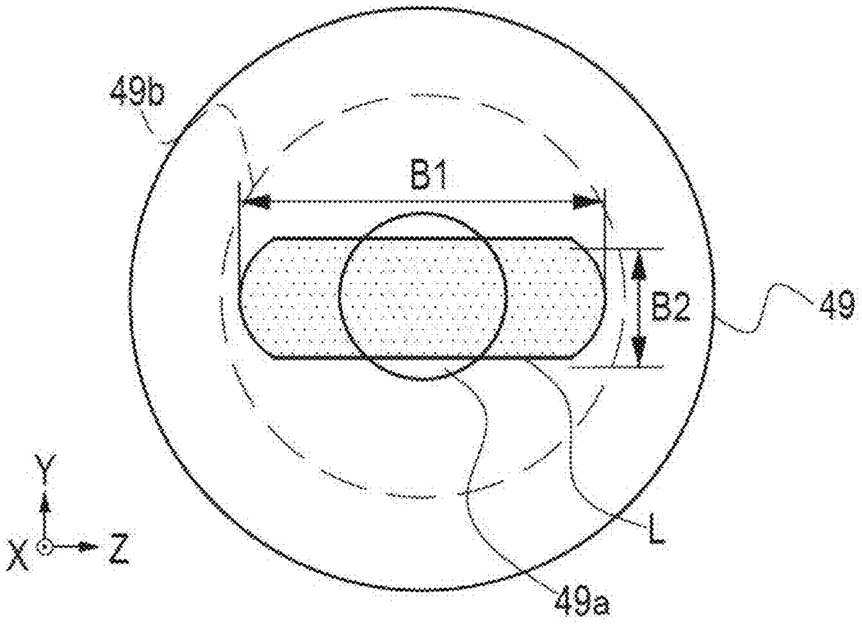
FIG. 16 illustrates a relationship between the beam shape of the laser beam which passes through the transfer mask and enters the NA adjusting aperture and the effective projection area.

The introducing optical system 46 and the transfer mask 47 are disposed so as to irradiate the diaphragm hole 49*a* with the laser beam L. FIG. 16 illustrates a relationship between the beam shape of the laser beam L which passes through the transfer mask 47 and enters the NA adjusting aperture 49 and the effective projection area 49*b*. The transfer mask 47 is disposed such that the beam width B2 of the laser beam L in the Y direction is shorter than a diameter of the diaphragm hole 49*a*, and the beam width B1 in the Z direction is longer than the diameter of the diaphragm hole 49*a*.

In the present example, the NA adjusting aperture 49 is irradiated with the laser beam L having passed through the transfer mask 47 such that a Z direction component of the beam shape is included in the effective projection area 49*b* and a Y direction component of the beam shape is included in the diaphragm hole 49*a*. The NA adjusting aperture 49 reduces the NA difference by shielding a part of the laser beam L by the diaphragm hole 49*a*.

In the present embodiment, the resin film 40 is disposed on the surface that is a processing surface of the workpiece 41. In the present example, a film made of a polyimide is used as the resin film 40. The resin film 40 may be a film formed of a resin material having excellent heat resistance. The resin film 40 may be, for example, a film made of a fluorine-based polymer material such as a PTFE (polyfluorinated ethylene) film, a PPS (polyphenylene sulfide) film, or a PEEK (polyether ether ketone) film. The resin film 40 is an example of a "resin layer" according to the technology of the present disclosure.

2.2 Operation

Figure 17:
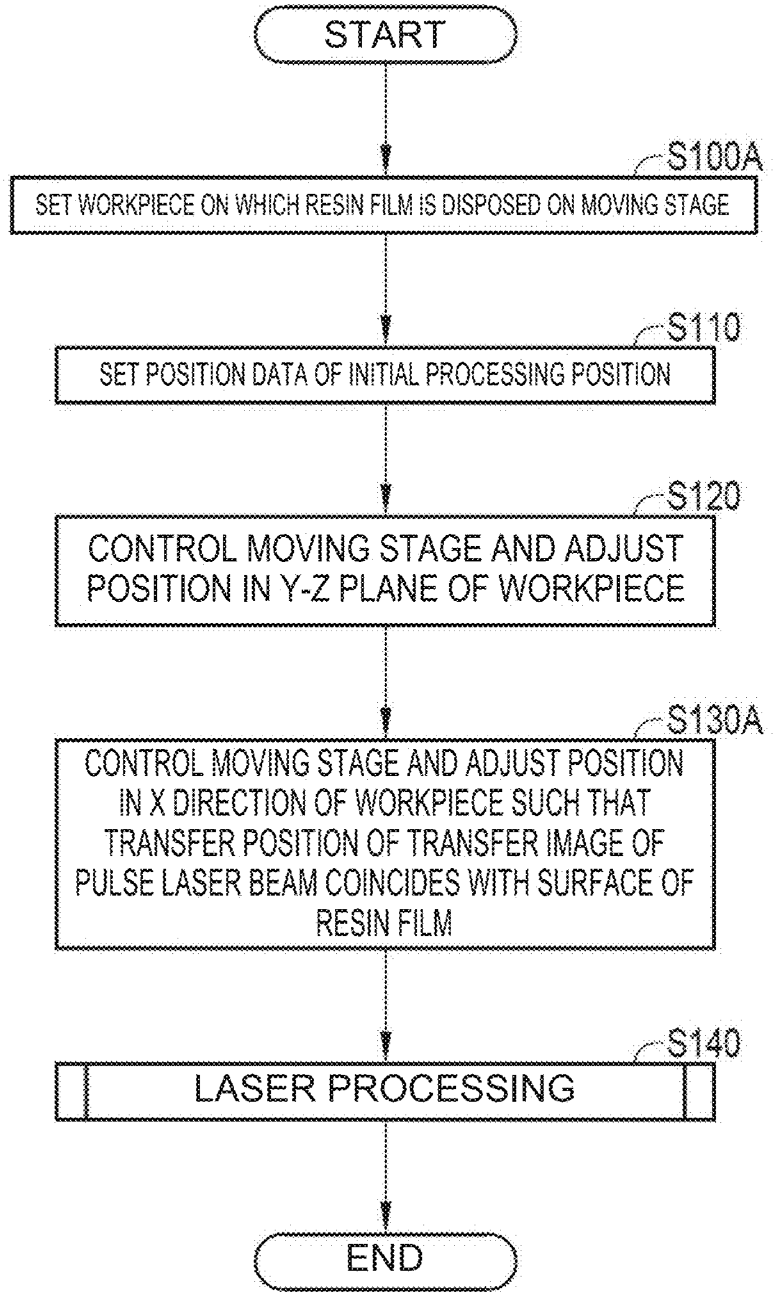
FIG. 17 is a flowchart illustrating the laser processing procedure of the first embodiment.

Next, an operation of the laser processing apparatus 2A and the laser processing method according to the present embodiment will be described. FIG. 17 is a flowchart illustrating steps of the laser processing method in the present embodiment. The flowchart of the first embodiment differs from the flowchart of the comparative example in that step S100 is changed to step S100A and step S130 is changed to step S130A, and the rest is similar.

First, the resin film 40 is disposed on the surface of the workpiece 41. For example, the resin film 40 is attached to the surface of the workpiece 41. The workpiece 41 on which the resin film 40 is disposed is set on the table 33 of the moving stage 34 (S100A). A laser processing processor 32A executes step S130A after executing processes of step S110 to step S120 in the same manner as in the comparative example.

In step S130A, the laser processing processor 32A adjusts the position of the workpiece 41 in the X direction by controlling the moving amount of the moving stage 34 based on the position data. Accordingly, the transfer position FP and the workpiece 41 are relatively positioned so that the transfer position FP and the surface 40*a* of the resin film 40 coincide with each other in the X direction.

After the workpiece 41 is positioned, the laser processing is performed (S140). The processing content of step S140 is the same as the process of the comparative example illustrated in FIG. 3.

Figure 18:
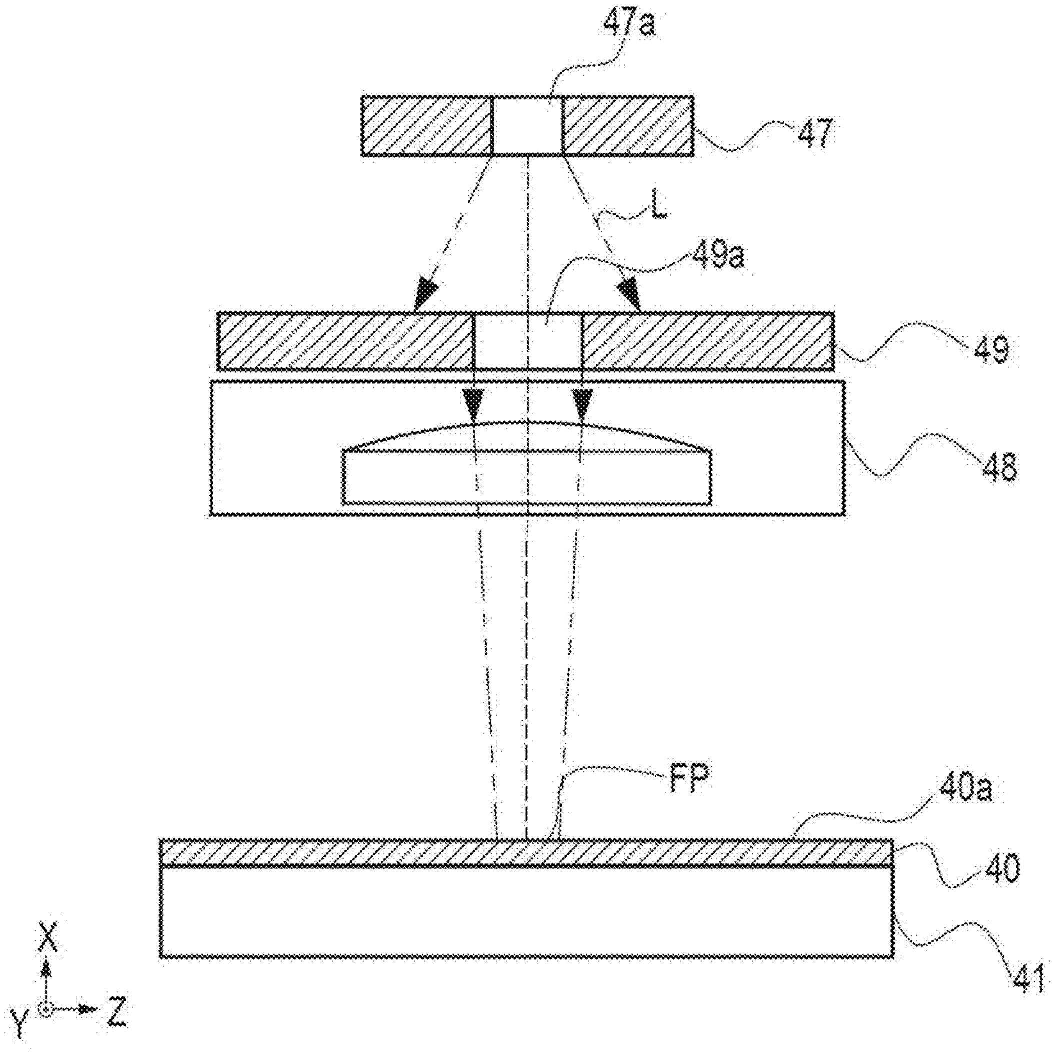
FIG. 18 illustrates an outline of the laser processing of the workpiece having the resin film disposed thereon using the laser processing apparatus according to the first embodiment.

FIG. 18 illustrates the laser processing of the workpiece 41 having the resin film 40 disposed thereon using the laser processing apparatus 2A according to the first embodiment. As illustrated in FIG. 18, in the present example, the projection optical system 48 is irradiated with the laser beam L having passed through the transfer mask 47 with the NA difference reduced in the NA adjusting aperture 49. Then, the projection optical system 48 is irradiated with the laser beam L so that the transfer position FP of the transfer image of the beam of the incident laser beam L coincides with the surface 40*a* of the resin film 40.

Figure 19:
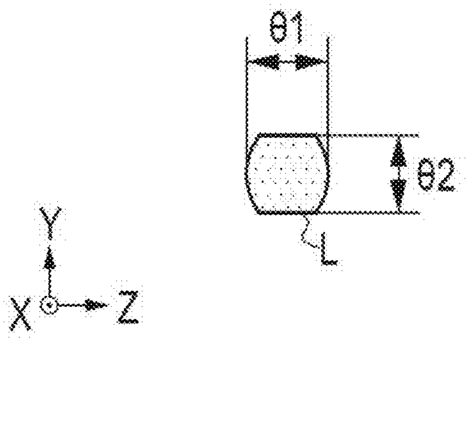
FIG. 19 illustrates a relationship between the first divergence angle and the second divergence angle of the laser beam after passing through the NA adjusting aperture.

The NA adjusting aperture 49 reduces the NA difference and the projection optical system 48 is irradiated with the laser beam L entering from the transfer mask 47. That is, as illustrated in FIG. 19, the first divergence angle θ1 and the second divergence angle θ2 of the NA adjusting aperture 49 are substantially the same. As described above, in the present example, the workpiece 41 is drilled with the laser beam L having the reduced NA difference.

2.3 Operation and Effects

As described above, the laser processing apparatus 2A of the present embodiment forms a hole in the workpiece 41 by irradiating the workpiece 41 having the resin film 40 disposed on the processing surface with the laser beam L discharge-excited between the pair of electrodes 22*a* and 22*b* and then output, and includes: the laser apparatus 3 which outputs the laser beam L having the first divergence angle θ1 in the discharge direction between the pair of electrodes 22*a* and 22*b* larger than the second divergence angle θ2 in the direction perpendicular to the discharge direction and the traveling direction of the laser beam L; the transfer mask 47 which forms the circular pattern; the introducing optical system 46 for guiding the laser beam L to the transfer mask 47; the projection optical system 48 which images the circular pattern on the resin layer; and the NA adjusting aperture 49 which is disposed on the optical path of the laser beam L and adjusts the difference between the first divergence angle θ1 and the second divergence angle θ2 to be reduced.

The laser processing method of the present embodiment is for forming a hole in the workpiece 41 by irradiating the workpiece 41 having the resin film 40 disposed on the processing surface with the laser beam L discharge-excited between the pair of electrodes 22*a* and 22*b* and then output, and includes: a workpiece setting step S100A of setting the workpiece 41 having the resin film 40 disposed thereon on the table 33 of the moving stage 34; a transfer positioning step S130 of performing relative positioning between the transfer position FP and the workpiece 41 such that the transfer position FP and the surface 40*a* of the resin film 40 coincide; a laser outputting step of outputting the laser beam L, having the first divergence angle θ1 in the discharge direction between the pair of electrodes 22*a* and 22*b* larger than the second divergence angle θ2 in the direction perpendicular to the discharge direction and the traveling direction of the laser beam L, to the workpiece 41 on which the resin film 40 disposed; an introducing optical step of guiding the laser beam L to the transfer mask 47; a transfer pattern forming step of forming the circular pattern; a transfer imaging step of imaging the circular pattern on the resin film 40; and a divergence angle adjusting step of adjusting the difference between the first divergence angle θ1 and the second divergence angle θ2 to be reduced.

According to the laser processing apparatus 2A and the laser processing method of the present embodiment, the drilling processing is executed to the workpiece 41 having the resin film 40 disposed thereon with the laser beam L having the reduced NA difference, so that the shape of the processed hole approaches a circle from the substantially elliptical shape as illustrated in the comparative example. Thus, it is possible to suppress bulging and cracking around the processed hole.

In order to confirm the operation and the effects of the present embodiment, a plurality of resin films 40 having different thicknesses were disposed on the workpiece 41, and the drilling processing was executed by the laser processing apparatus 2A. Here, a glass substrate having a thickness of 400 μm was used as the workpiece 41.

Figure 20:
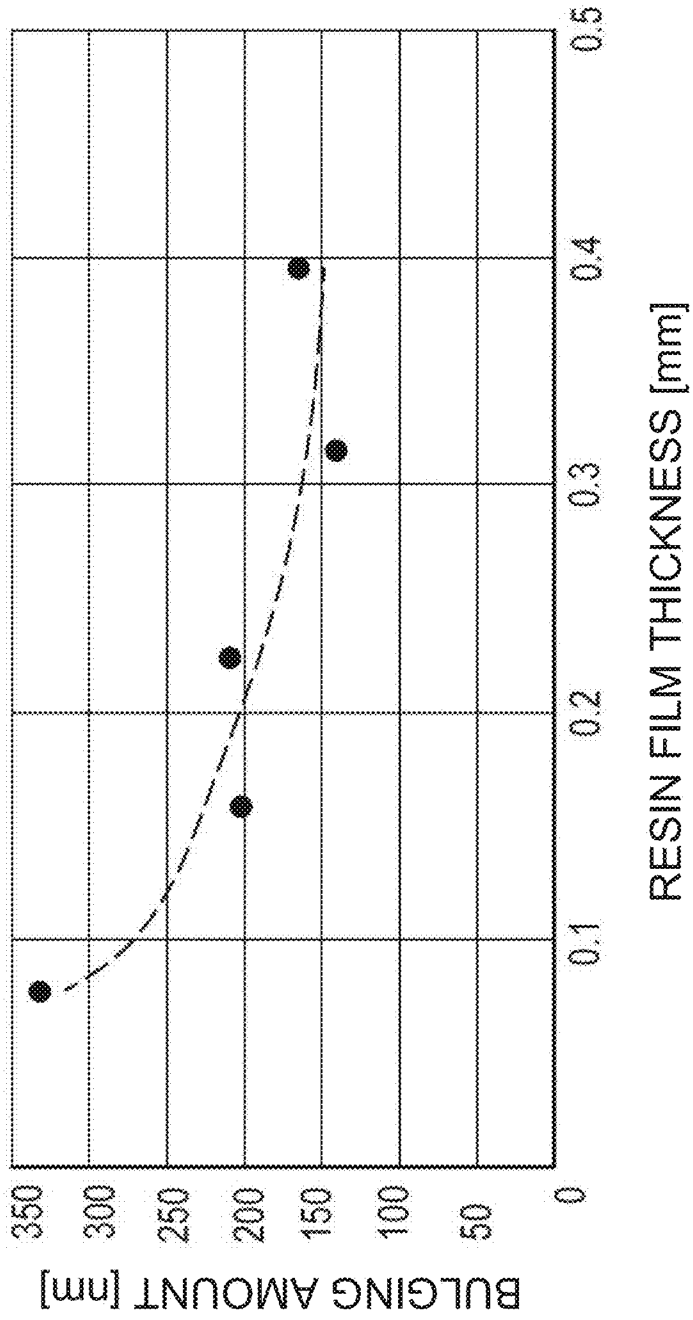
FIG. 20 is a graph illustrating a bulging suppressing effect in the processing of the workpiece having the resin film disposed thereon by the laser processing apparatus according to the first embodiment.

FIG. 20 is a graph illustrating a relationship between a thickness of the resin film 40 and a bulging amount when the drilling processing is executed to the glass substrate on which the resin films 40 having five different thicknesses are disposed.

When a polyimide film having a thickness of 0.08 mm was used as the resin film 40, cracking of the workpiece 41 was suppressed. At the same time, the bulging amount around the processed hole decreased to be equal to or smaller than 350 nm.

As the thickness of the resin film 40 increased from 0.08 mm to 0.4 mm, the bulging amount around the processed hole also decreased. Further, when the thickness of the resin film 40 became equal to or greater than 0.4 mm, the bulging amount decreased to about 150 nm.

In this way, according to the first embodiment, even with the high fluence laser beam L required for processing the through-hole, it is confirmed that it is possible to suppress bulging and cracking around the processed hole of the workpiece 41.

Figure 21:
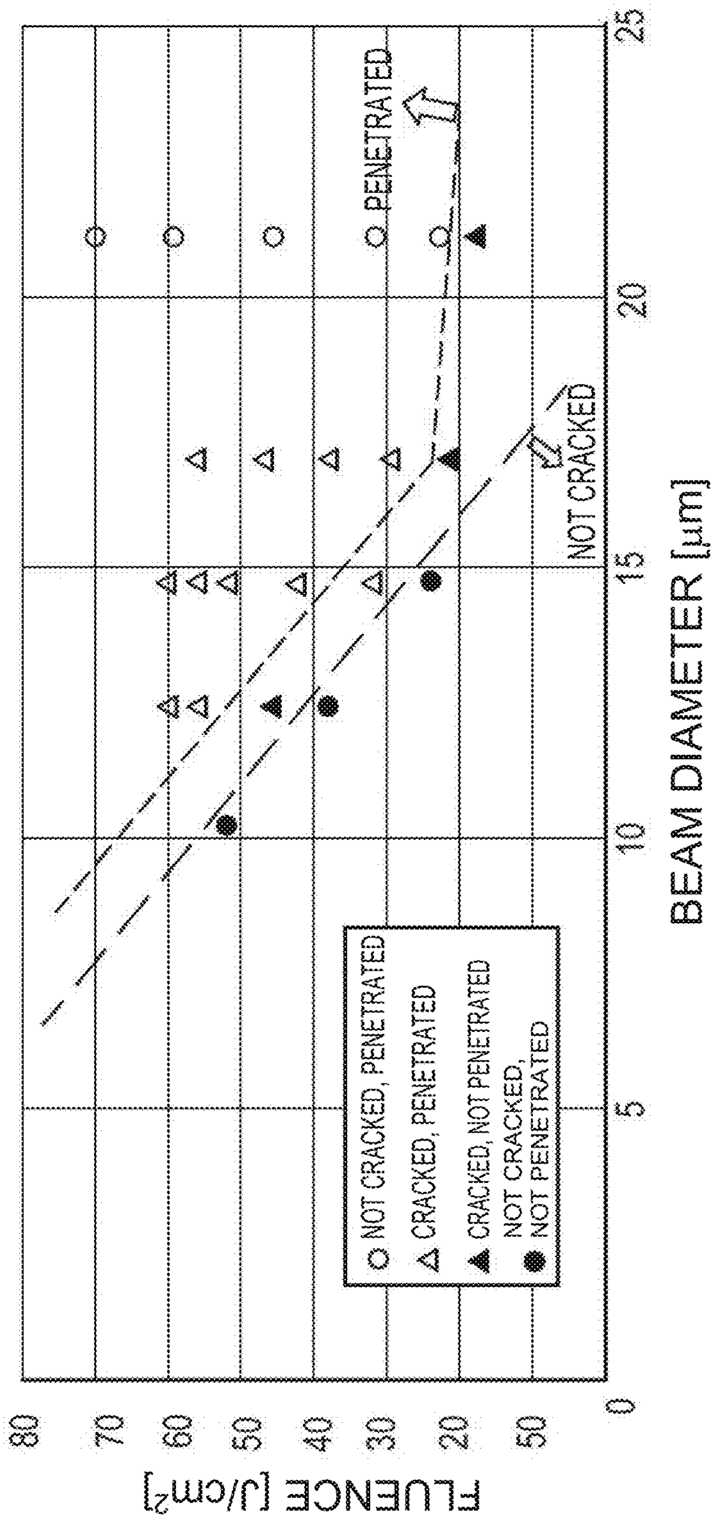
FIG. 21 is a graph illustrating that cracking is suppressed in the processing of the workpiece having the resin film disposed thereon by the laser processing apparatus according to the first embodiment.

Further, using the laser processing apparatus 2A, the drilling processing was executed to the glass substrate on which the resin film 40 having the thickness of 0.1 mm was disposed, with the plurality of fluences and beam diameters. FIG. 21 is a graph illustrating the relationship between the fluence and the beam diameter of the laser beam L. As illustrated in FIG. 21, when the beam diameter was 20.9 μm and the fluence was equal to or larger than 23 J/cm$^2$, cracking did not occur and a through-hole was formed. That is, according to the first embodiment, it is confirmed that it is possible to suppress cracking even with the fluence and the beam diameter necessary for forming the through-hole.

Figure 22:
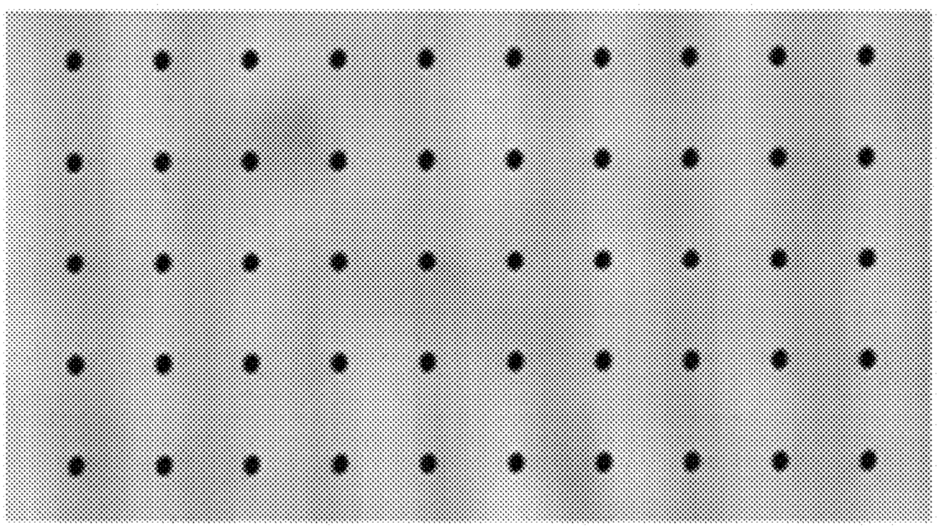
FIG. 22 is a photograph illustrating a result of the laser processing of a glass substrate having the resin film disposed thereon using the laser processing apparatus according to the first embodiment.
Figure 23:
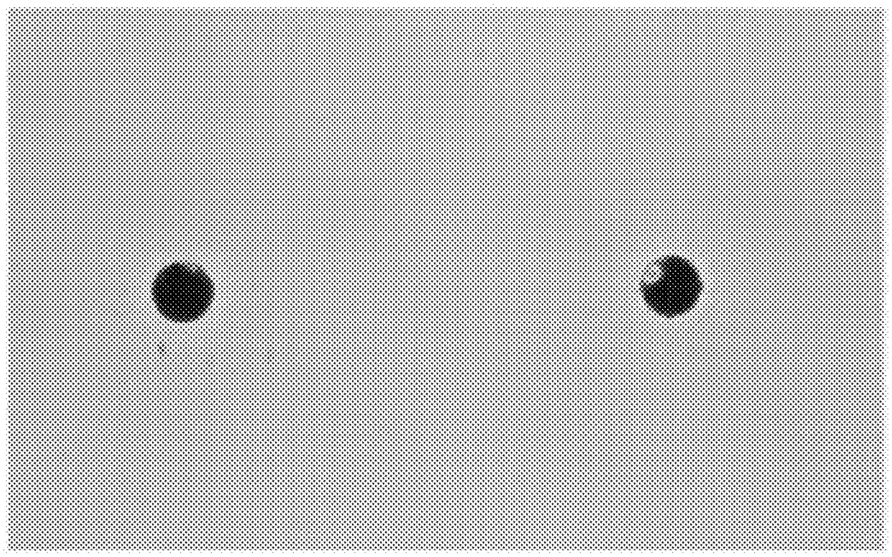
FIG. 23 is a photograph illustrating a result of improving a shape of the processed hole.

FIG. 22 and FIG. 23 are SEM photographs illustrating a result of the laser processing of the glass substrate having the resin film 40 disposed thereon. According to the first embodiment, it is confirmed that a clean through-hole without cracking is formed as illustrated in FIG. 22 and the shape of the through-hole is improved to be a circular shape as illustrated in FIG. 23.

2.4 Modifications of NA Adjusting Aperture

Modifications of the NA adjusting aperture 49 will now be described. In the first embodiment, the shape of the diaphragm hole 49*a* of the NA adjusting aperture 49 is circular, but the shape of the diaphragm hole 49*a* is not limited to the circular shape, and may be a polygonal shape such as a rectangular shape.

Figure 24:
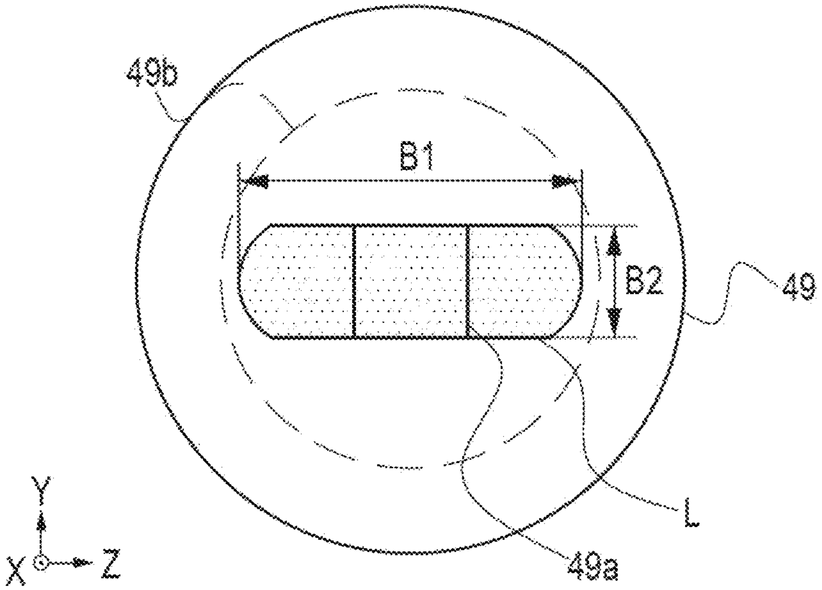
FIG. 24 is a diagram illustrating a first modification of the NA adjusting aperture.

FIG. 24 illustrates a first modification of the NA adjusting aperture 49. The NA adjusting aperture 49 according to the first modification has a square diaphragm hole 49*a*. In the present example, the shape of the diaphragm hole 49*a* is a square shape the side of which is substantially the same length as the length of the beam width B2 of the laser beam L having passed through the transfer mask 47.

Figure 25:
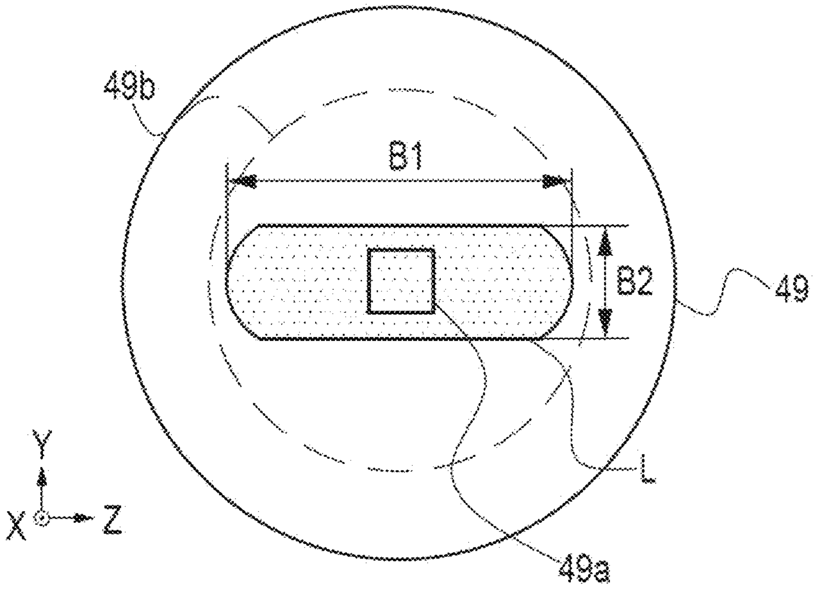
FIG. 25 is a diagram illustrating a second modification of the NA adjusting aperture.

FIG. 25 illustrates a second modification of the NA adjusting aperture 49. The NA adjusting aperture 49 according to the second modification has a square diaphragm hole 49*a*. In the present example, the shape of the diaphragm hole 49*a* is a square shape the side of which is the length shorter than the length of the beam width B2 of the laser beam L having passed through the transfer mask 47.

3. Second Embodiment

Next, a laser processing apparatus 2B and the laser processing method of a second embodiment will be described. Any component same as that described above is denoted by an identical reference sign, and any redundant description thereof is omitted unless specific description is needed.

3.1 Configuration

Figure 26:
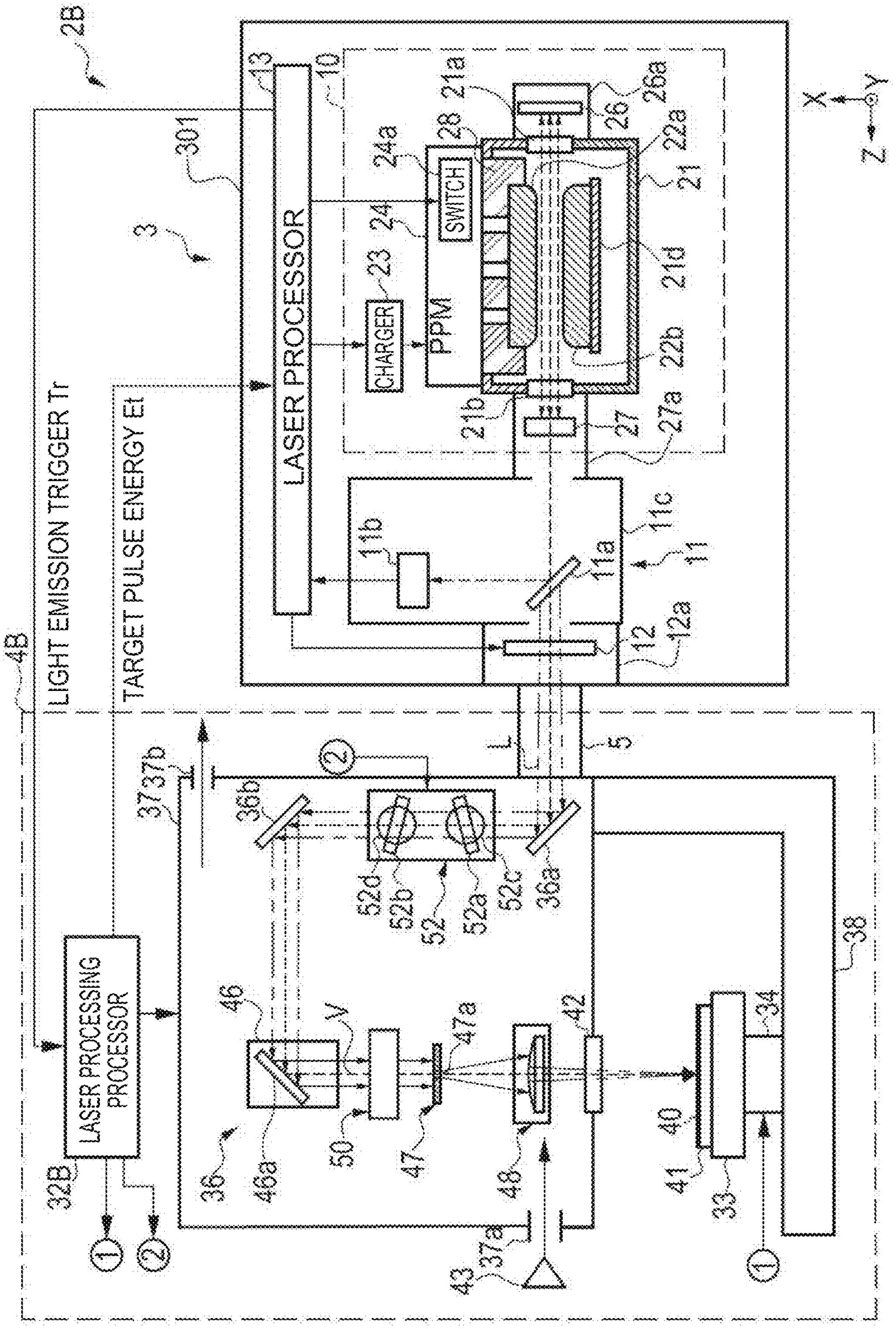
FIG. 26 schematically illustrates a configuration of the laser processing apparatus according to a second embodiment.

FIG. 26 schematically illustrates a configuration of the laser processing apparatus 2B according to the second embodiment. The laser processing apparatus 2B of the second embodiment includes a laser processing apparatus main body 4B instead of the laser processing apparatus main body 4A of the laser processing apparatus 2A according to the first embodiment.

The laser processing apparatus 2B differs from the laser processing apparatus 2A of the first embodiment in that a beam expander 50 is provided instead of the NA adjusting aperture 49. The remaining configuration of the laser processing apparatus 2B is the same as that of the laser processing apparatus 2A of the first embodiment. The beam expander 50 is an example of the "divergence angle adjusting optical system" according to the technology of the present disclosure.

As illustrated in FIG. 26, the beam expander 50 is disposed between the introducing optical system 46 and the transfer mask 47. The beam expander 50 is configured by at least one optical element which adjusts the beam width of the laser beam L. Examples of the optical element include a prism and a cylindrical lens. The number of the optical elements is selected as necessary.

By expanding or reducing the beam width of the laser beam L by the beam expander 50, it is possible to reduce the NA difference. A change in the beam width and a change in the divergence angle are in an inversely proportional relationship. Specifically, when the beam width is expanded, the divergence angle is reduced, and conversely, when the beam width is reduced, the divergence angle is increased. That is, since the first divergence angle θ1 is larger than the second divergence angle θ2, the NA difference can be reduced by expanding the beam width B1 (see FIG. 4) corresponding to the first divergence angle θ1 and reducing the first divergence angle θ1. Conversely, the NA difference can also be reduced by reducing the beam width B2 (see FIG. 4) corresponding to the second divergence angle θ2 and increasing the second divergence angle θ2.

Figure 27:
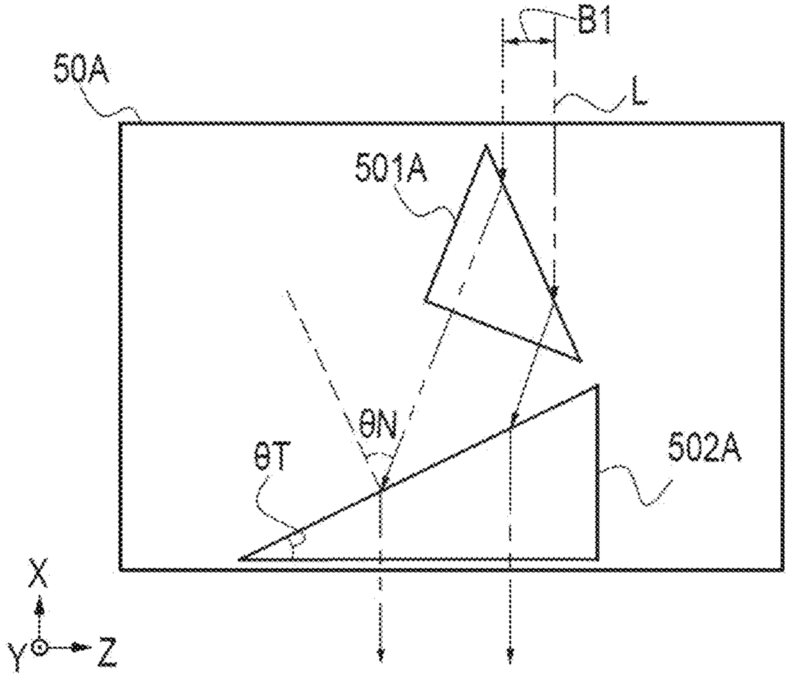
FIG. 27 illustrates a configuration of a beam width expansion type beam expander.

FIG. 27 illustrates an example of a configuration of a beam width expansion type beam expander 50A. The beam expander 50A is configured by a prism 501A of a right-angled isosceles triangle and a prism 502A. The prism 501A is disposed upstream of the prism 502A.

The prism 501A and the prism 502A are disposed, for example, at positions where an incident angle θN of the laser beam L entering a refractive surface of the prism 502A from the prism 501A is the same as an apex angle θT of the prism 502A. Preferably, the prism 501A and the prism 502A are disposed such that the traveling direction of the laser beam L entering the beam expander 50A and the traveling direction of the laser beam L output from the beam expander 50A are parallel to each other.

The beam expander 50A reduces the NA difference by expanding the beam width B1 of the laser beam L by a beam expansion ratio Mbc1 and reducing the first divergence angle θ1. The beam expansion ratio Mbc1 is a value obtained by dividing the first divergence angle θ1 by the second divergence angle θ2. A reduction ratio of the first divergence angle θ1 is an inverse of the beam expansion ratio Mbc1. Specifically, the beam expander 50A is configured to satisfy the following relational equations (3) to (5).

$$Mbc1 = \theta 1 / \theta 2 \tag{3}$$

$$BS1 = B1 \times Mbc1 \tag{4}$$

$$BS2 = B2 \tag{5}$$

Here, BS1 is the beam width in the Z direction of the laser beam L output from the beam expander 50A. BS2 is the beam width in the Y direction of the laser beam L output from the beam expander 50A.

Figure 28:
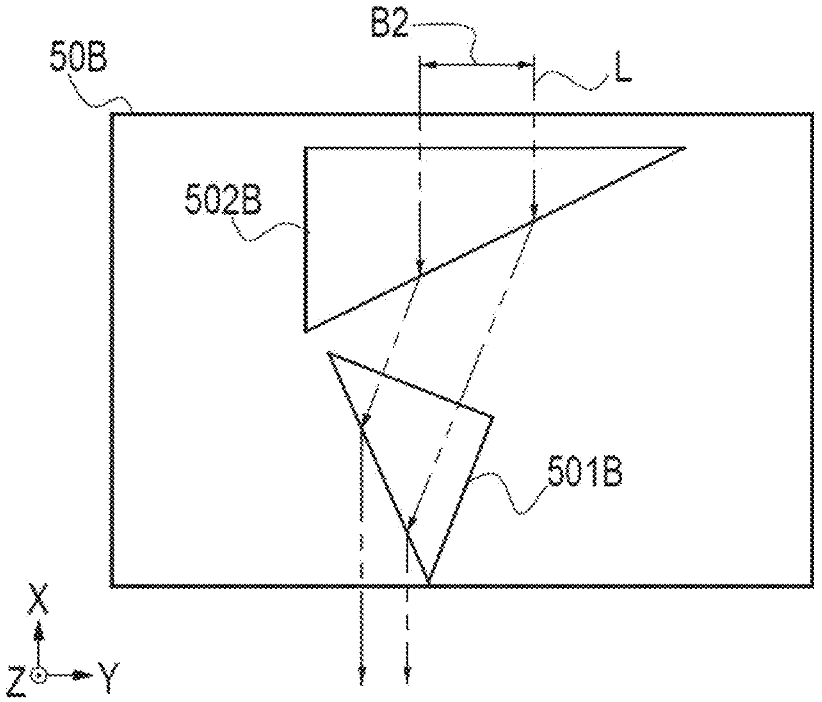
FIG. 28 illustrates a configuration of a beam width reduction type beam expander.

FIG. 28 illustrates an example of a configuration of a beam width reduction type beam expander 50B. The beam expander 50B is configured by a prism 501B of the right-angled isosceles triangle and a prism 502B. The prism 501B is disposed downstream of the prism 502B. The prism 501B and the prism 502B have the same configuration as the prism 501A and the prism 502A illustrated in FIG. 27 except that the positional relationship therebetween is reversed.

The beam expander 50B reduces the NA difference by reducing the beam width B2 of the laser beam L by a beam reduction ratio Mbc2 and expanding the second divergence angle θ2. The beam reduction ratio Mbc2 is a value obtained by dividing the second divergence angle θ2 by the first divergence angle θ1. The expansion ratio of the second divergence angle θ2 is the inverse of the beam reduction ratio Mbc2. Specifically, the beam expander 50B is configured to satisfy the following relational equations (6) to (8).

$$Mbc2 = \theta 2 / \theta 1 \tag{6}$$

$$BS2 = B2 \times Mbc2 \tag{7}$$

$$BS1 = B1 \tag{8}$$

Figure 29:
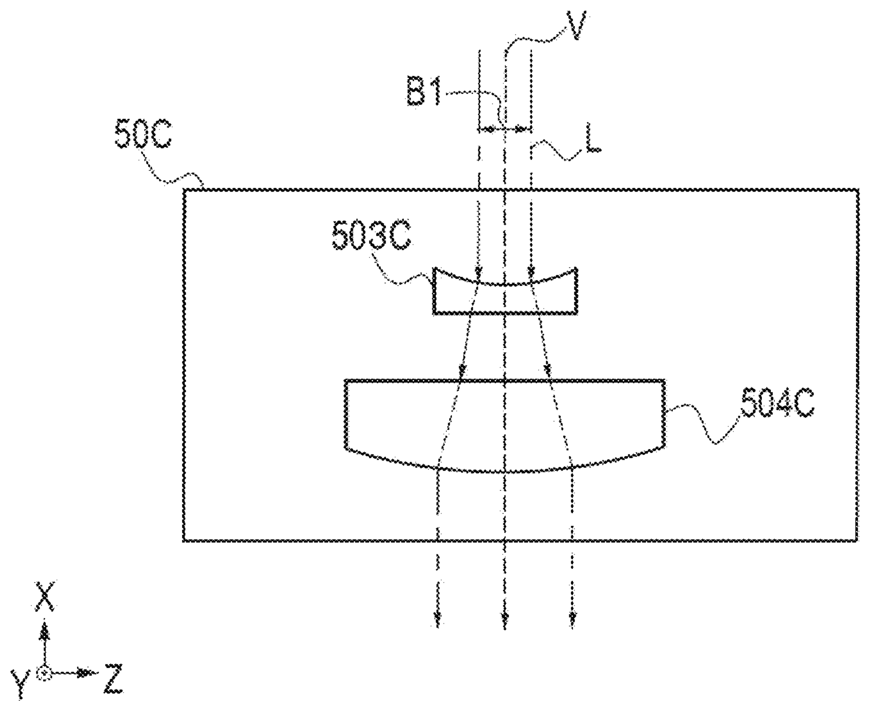
FIG. 29 illustrates a configuration of a beam width expansion type beam expander.

FIG. 29 illustrates another configuration example of the beam width expansion type beam expander. As illustrated in FIG. 29, a beam expander 50C includes a cylindrical concave lens 503C and a cylindrical convex lens 504C. The cylindrical concave lens 503C is disposed upstream of the cylindrical convex lens 504C. The cylindrical concave lens 503C and the cylindrical convex lens 504C are configured to reduce the NA difference by expanding the beam width B1 of the laser beam L and reducing the first divergence angle θ1.

The cylindrical concave lens 503C and the cylindrical convex lens 504C each have a cylindrical surface having a central axis parallel to an optical axis V and a flat surface parallel to a VH surface of the laser beam L. A focal length of the cylindrical convex lens 504C is longer than a focal length of the cylindrical concave lens 503C. The cylindrical concave lens 503C and the cylindrical convex lens 504C are disposed such that positions of their front focal points substantially overlap each other.

Figure 30:
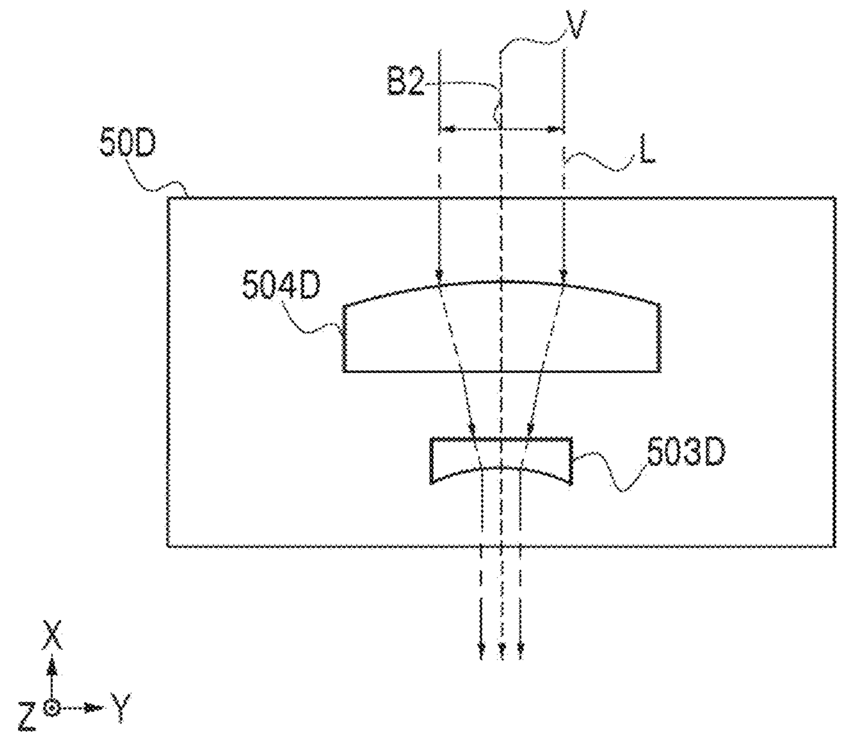
FIG. 30 illustrates a configuration of a beam width reduction type beam expander.

FIG. 30 illustrates another configuration example of a beam reduction type beam expander. As illustrated in FIG. 30, a beam expander 50D includes a cylindrical convex lens 504D and a cylindrical concave lens 503D. The cylindrical convex lens 504D is disposed upstream of the cylindrical concave lens 503D. The cylindrical convex lens 504D and the cylindrical concave lens 503D are configured to reduce the NA difference by reducing the beam width B2 of the laser beam L and increasing the second divergence angle θ2.

A configuration of the cylindrical convex lens 504D is the same as a configuration in which the cylindrical convex lens 504C is inverted and disposed upstream. A configuration of the cylindrical concave lens 503D is the same as a configuration in which the cylindrical concave lens 503C is inverted and disposed downstream.

3.2 Operation

Figure 31:
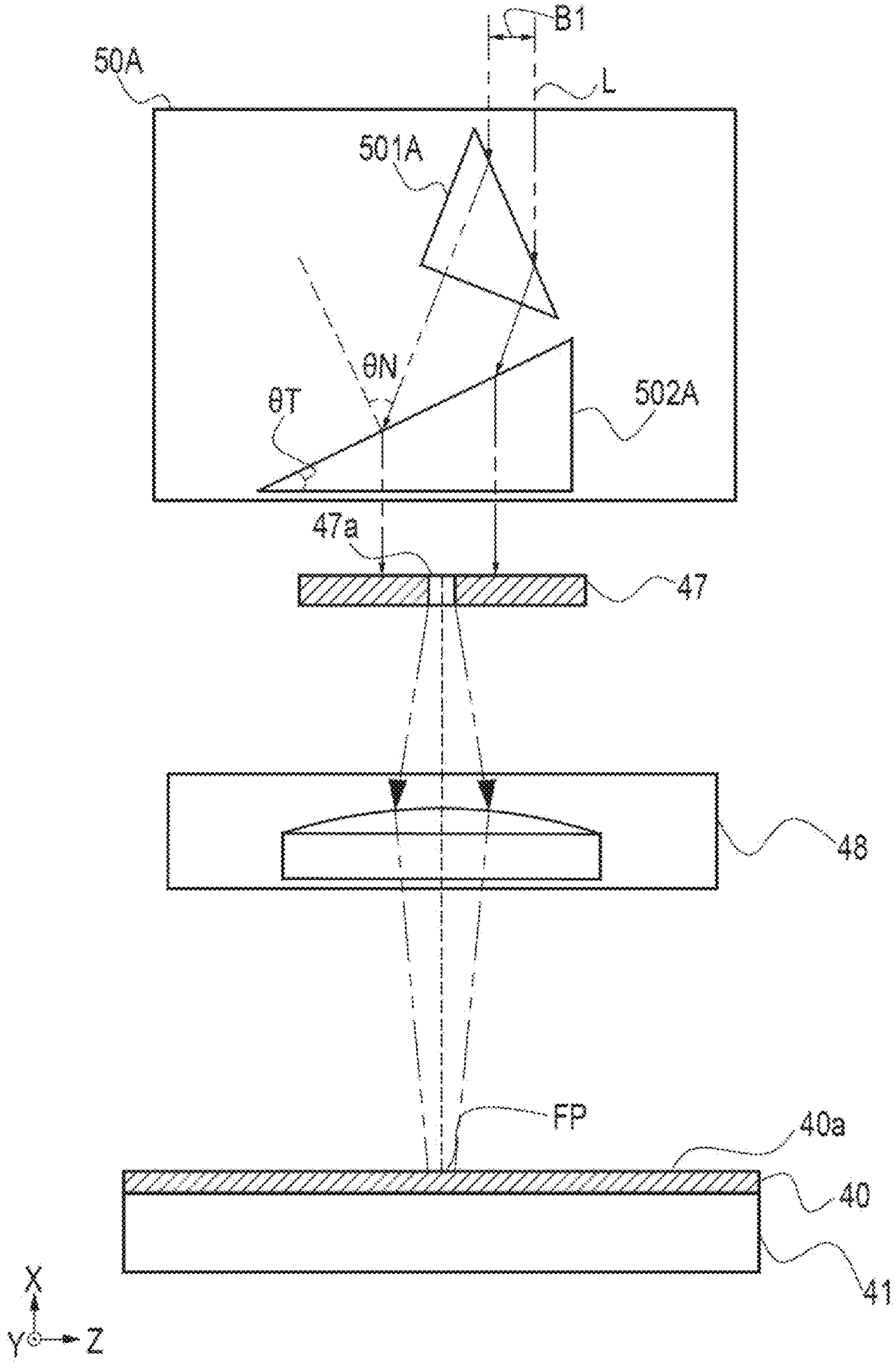
FIG. 31 illustrates an outline of an operation of executing the laser processing using the beam width expansion type beam expander.

FIG. 31 illustrates an outline of an operation of executing the laser processing using the beam width expansion type beam expander 50A. As illustrated in FIG. 31, in the present example, the laser beam L that has passed through the optical device 36 enters the beam expander 50A. The beam width B1 of the laser beam L which has entered the beam expander 50A is expanded to the beam width BS1 by the prism 501A and the prism 502A and the laser beam L is output.

Figure 32:
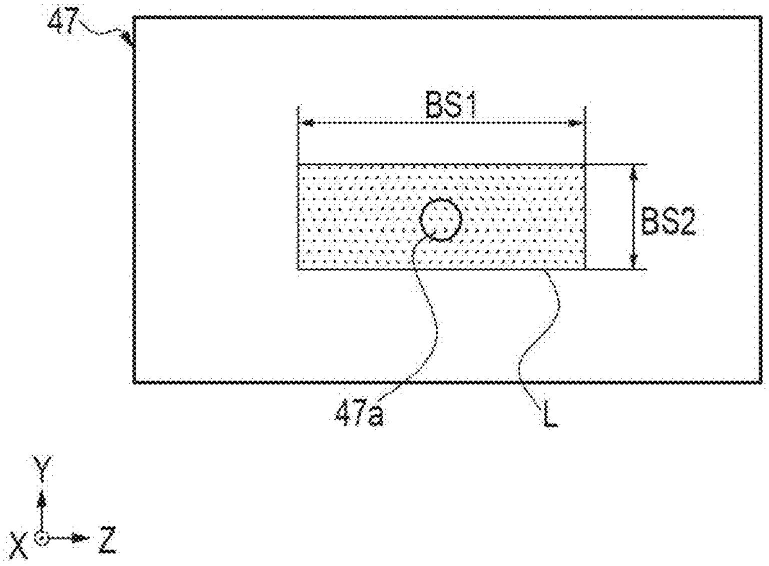
FIG. 32 is a diagram illustrating the shape of the beam with which the transfer mask is irradiated.
Figure 33:
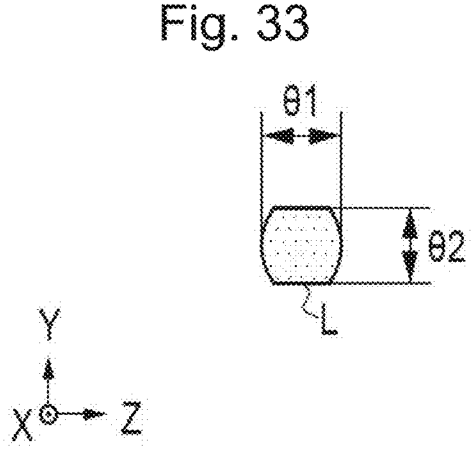
FIG. 33 illustrates an NA difference in the shape of the beam with which the beam expander is irradiated.

In the present example, the transfer mask 47 is irradiated with the laser beam L output from the beam expander 50A as illustrated in FIG. 32. Since the first divergence angle θ1 is reduced by expanding the beam width B1 as described above, for the laser beam L with which the transfer mask 47 is irradiated, the second divergence angle θ2 and the first divergence angle θ1 are substantially the same as illustrated in FIG. 33.

The projection optical system 48 is irradiated with the laser beam L having passed through the pinhole 47*a*, of the laser beam L with which the transfer mask 47 is irradiated. The projection optical system 48 is irradiated with the laser beam L so that the transfer position FP of the transfer image of the beam of the incident laser beam L coincides with the surface 40*a* of the resin film 40. Thus, the workpiece 41 is drilled with the laser beam L having the reduced NA difference.

In the present example, when the beam width expansion type beam expander 50A is used, the beam width B1 is expanded in order to reduce the NA difference so that an aspect ratio of the beam shape of the laser beam L with which the transfer mask 47 is irradiated is increased. Therefore, a plurality of the pinholes 47*a* can be formed in the transfer mask 47.

Figure 34:
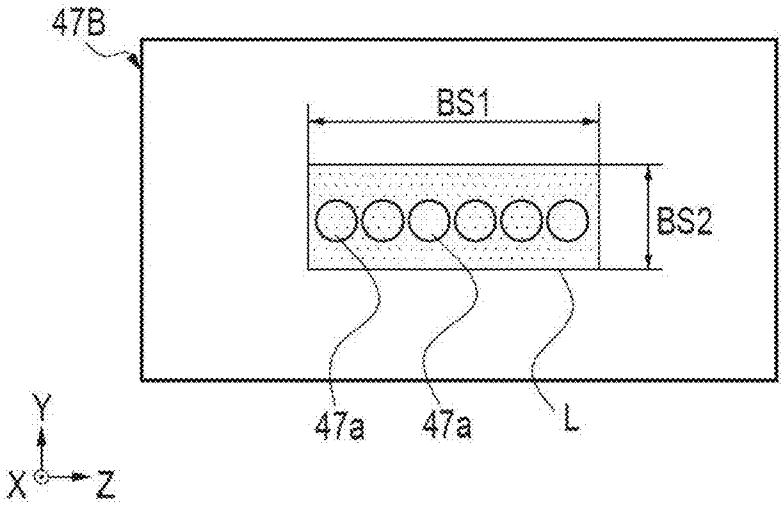
FIG. 34 is a diagram illustrating the shape of the beam with which the transfer mask is irradiated.

In the present example, the drilling processing can be executed using a multipoint transfer mask 47B having the pinholes 47*a* as illustrated in FIG. 34. In the multipoint transfer mask 47B, the pinholes 47*a* are arrayed in the Z direction in which the beam width B1 is expanded. The pinholes 47*a* are irradiated so as to be covered with the laser beam L output from the beam expander 50A. A plurality of holes are simultaneously formed in the workpiece 41 by the laser beam L having passed through the pinholes 47*a*.

Figure 35:
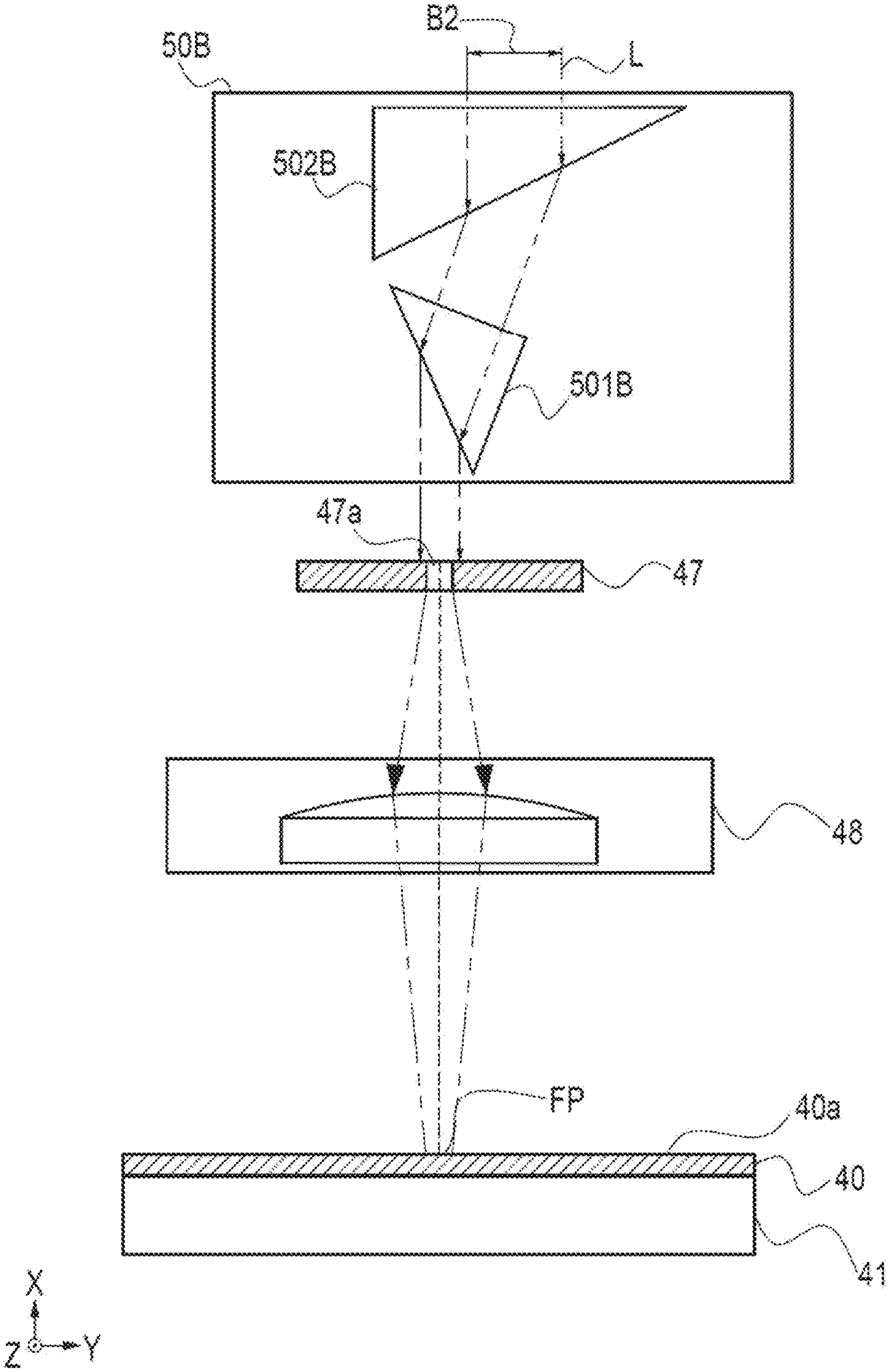
FIG. 35 illustrates an outline of an operation of executing the laser processing using the beam width reduction type beam expander.

FIG. 35 illustrates an outline of an operation of executing the laser processing using the beam width reduction type beam expander 50B. As illustrated in FIG. 35, in the present example, the laser beam L that has passed through the optical device 36 enters the beam expander 50B. The beam width B2 of the laser beam L which has entered the beam expander 50B is reduced to a beam width BS2 by the prism 501B and the prism 502B and the laser beam L is output.

Figure 36:
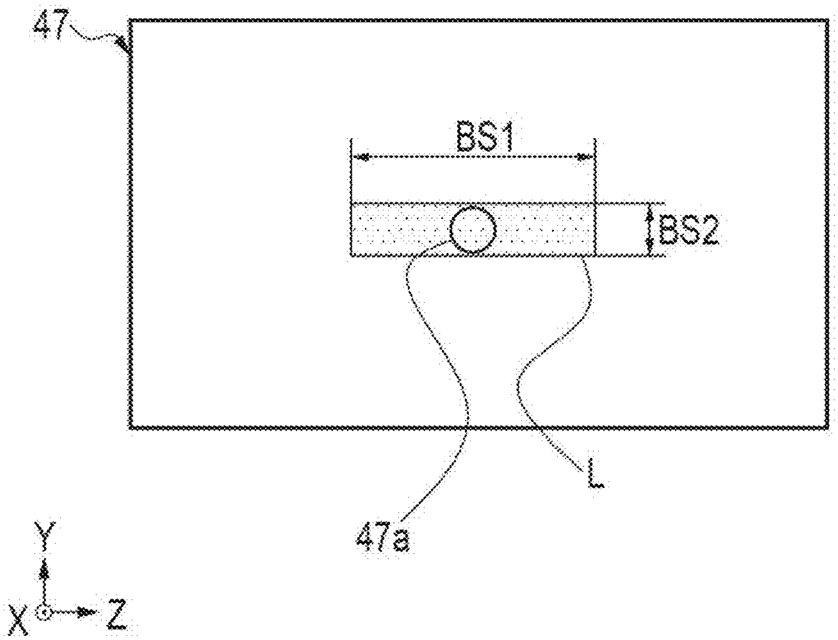
FIG. 36 is a diagram illustrating the shape of the beam with which the transfer mask is irradiated.

In the present example, the transfer mask 47 is irradiated with the laser beam L output from the beam expander 50B as illustrated in FIG. 36. Since the second divergence angle θ2 is increased by reducing the beam width B2 as described above, for the laser beam L with which the transfer mask 47 is irradiated, the second divergence angle θ2 and the first divergence angle θ1 are substantially the same as illustrated in FIG. 33.

Of the laser beam L with which the transfer mask 47 is irradiated, the projection optical system 48 is irradiated with the laser beam L having passed through the pinhole 47*a*. The projection optical system 48 is irradiated with the laser beam L so that the transfer position FP of the transfer image of the beam of the incident laser beam L coincides with the surface 40*a* of the resin film 40. Thus, the workpiece 41 is drilled with the laser beam L having the reduced NA difference.

In the present example, when the beam width reduction type beam expander 50B is used, the beam width B2 is reduced in order to reduce the NA difference so that the aspect ratio of the beam shape of the laser beam L with which the transfer mask 47 is irradiated is increased. Although beam area becomes small, a plurality of pinholes 47*a* can be formed in the transfer mask 47 in the present example as well when each pinhole 47*a* is sufficiently small.

3.3 Operation and Effects

As described above, the laser processing apparatus 2B of the present embodiment forms a hole in the workpiece 41 by irradiating the workpiece 41 having the resin film 40 disposed on the processing surface with the laser beam L discharge-excited between the pair of electrodes 22*a* and 22*b* and then output, and includes: the laser apparatus 3 which outputs the laser beam L having the first divergence angle θ1 in the discharge direction between the pair of electrodes 22*a* and 22*b* larger than the second divergence angle θ2 in the direction perpendicular to the discharge direction and the traveling direction of the laser beam L; the transfer mask 47 which forms the circular pattern; the introducing optical system 46 for guiding the laser beam L to the transfer mask 47; the projection optical system 48 which images the circular pattern on the resin layer; and the beam expander 50 which is disposed on the optical path of the laser beam L and adjusts the difference between the first divergence angle θ1 and the second divergence angle θ2 to be reduced.

According to the laser processing apparatus 2B and the laser processing method of the present embodiment, by adjusting the beam width of the laser beam L, the drilling processing is executed to the workpiece 41 having the resin film 40 disposed thereon with the laser beam L having the reduced NA difference. Therefore, the laser processing apparatus 2B according to the second embodiment can suppress bulging and cracking around the processed hole as in the first embodiment.

Further, according to the laser processing apparatus 2B of the second embodiment, since the aspect ratio of the beam shape is increased, the multipoint transfer mask can be suitably used.

The beam expander 50 is disposed between the introducing optical system 46 and the transfer mask 47 in the second embodiment, but the beam expander 50 may be disposed upstream of the introducing optical system 46.

4. Modification of Laser Processing Apparatus

In each of the embodiments, the laser processing apparatus can be variously modified. For example, a laser processing apparatus 2C illustrated in FIG. 37 may be used as a laser processing apparatus which simultaneously processes multiple holes in the workpiece 41.

Figure 37:
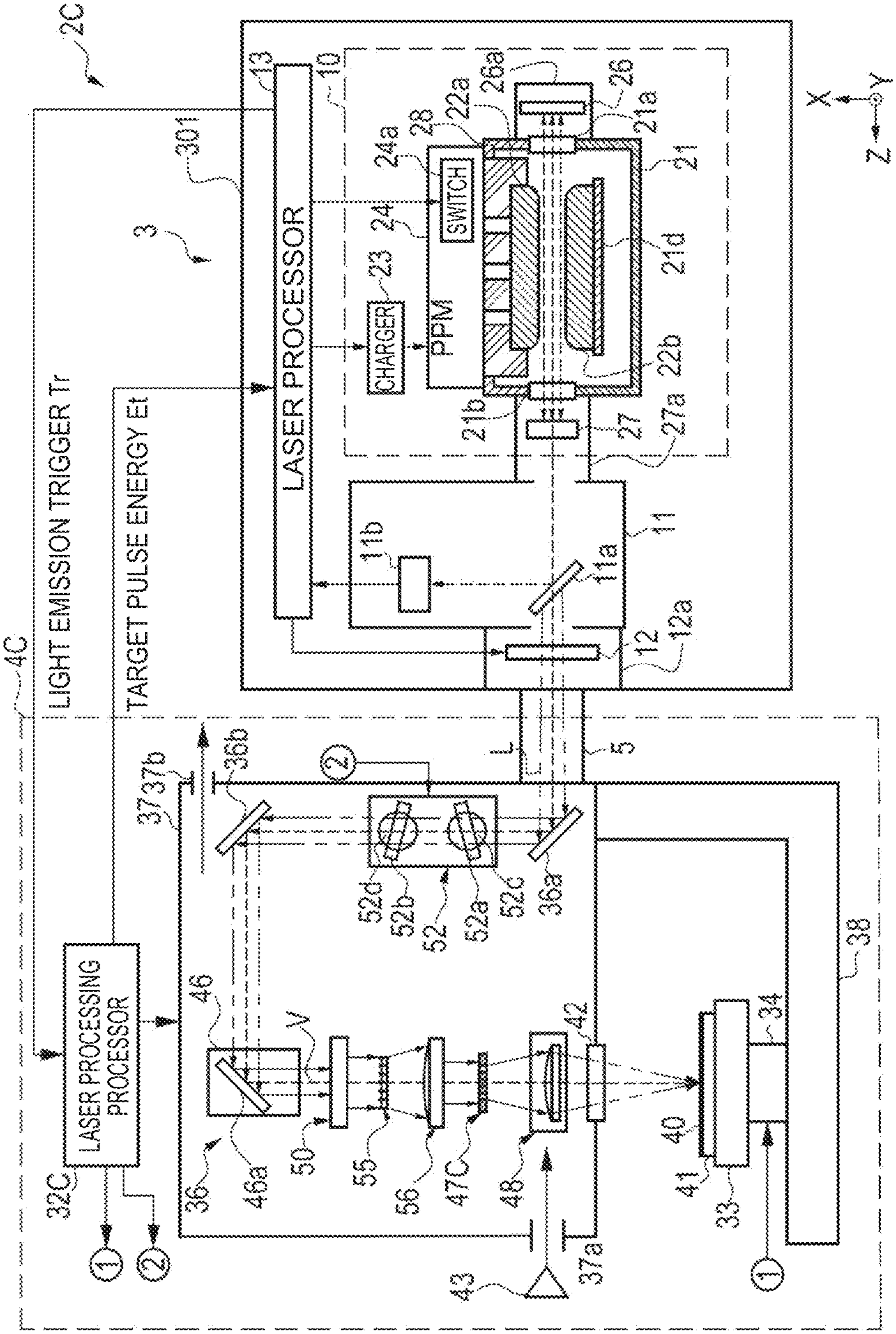
FIG. 37 schematically illustrates a configuration of the laser processing apparatus according to a modification.

FIG. 37 schematically illustrates a configuration of the laser processing apparatus 2C. The laser processing apparatus 2C includes a laser processing apparatus main body 4C instead of the laser processing apparatus main body 4B of the laser processing apparatus 2B according to the second embodiment.

4.1 Configuration

The laser processing apparatus main body 4C differs from the laser processing apparatus main body 4B of the second embodiment in that it includes a multipoint transfer mask 47C, a fly-eye lens 55, and a condenser lens 56. The laser processing apparatus main body 4C uses the multipoint transfer mask 47C instead of the transfer mask 47.

In the laser processing apparatus main body 4C, the introducing optical system 46, the beam expander 50, the fly-eye lens 55, the condenser lens 56, and the multipoint transfer mask 47C are disposed so that the laser beam L enters in this order. The remaining configuration of the laser processing apparatus 2C is the same as that of the laser processing apparatus 2B of the second embodiment.

The fly-eye lens 55 is a lens in which a plurality of lenses are arrayed in a honeycomb shape, for example, and is also called an integrator lens. The fly-eye lens 55 is disposed so that a focal plane on an output side of the fly-eye lens 55 coincides with a focal plane on an incident side of the condenser lens 56, and outputs the light so that the energy density of the laser beam L which enters the condenser lens 56 becomes uniform.

Figure 38:
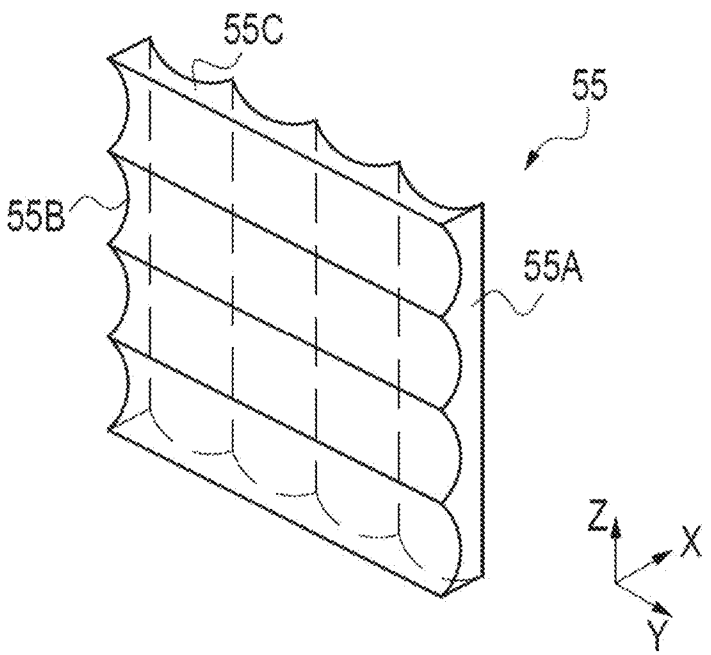
FIG. 38 is a perspective view illustrating a first configuration example of a fly-eye lens.

FIG. 38 illustrates a first configuration example of the fly-eye lens 55. The fly-eye lens 55 according to the first configuration example includes a transparent body 55A, cylindrical lenses 55B, and cylindrical lenses 55C. The fly-eye lens 55 is formed by arranging, on one surface of the transparent body 55A, many cylindrical lenses 55B in parallel in one direction and arranging, on the other surface of the transparent body 55A, many cylindrical lenses 55C in parallel in a direction perpendicular to the direction of the cylindrical lenses 55B on the one surface.

Figure 39:
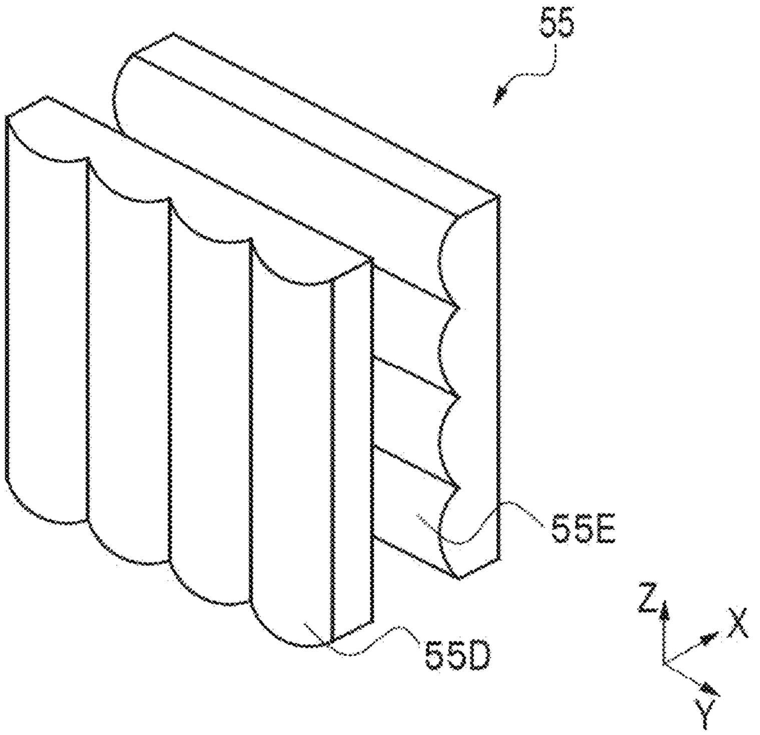
FIG. 39 is a perspective view illustrating a second configuration example of the fly-eye lens.

FIG. 39 illustrates a second configuration example of the fly-eye lens 55. The fly-eye lens 55 according to the second configuration example is configured by orthogonally disposing a lens 55D and a lens 55E formed by arranging many cylindrical lenses in parallel in one direction on one surface of the transparent body 55A.

The fly-eye lens 55 may be configured by forming a lens array on a transparent substrate such as a synthetic quartz substrate by an optical lithography process. Further, the fly-eye lens 55 may be configured by forming a plurality of Fresnel lens patterns on a transparent substrate such as a synthetic quartz substrate by the optical lithography process.

Figure 40:
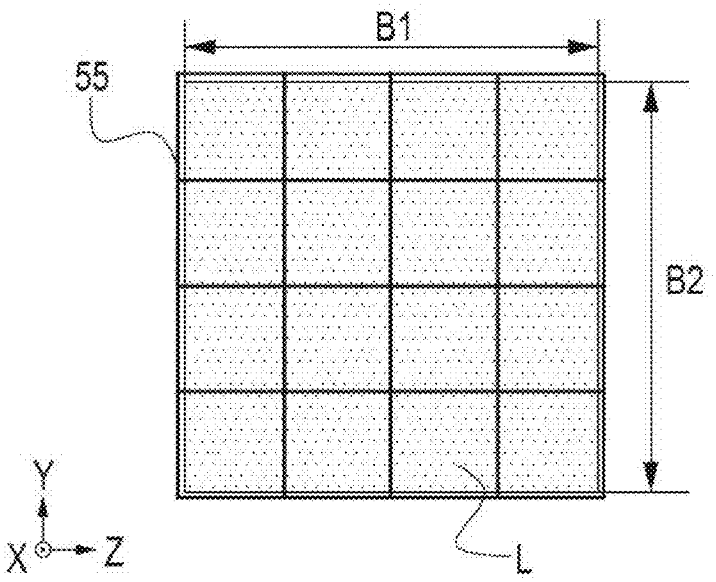
FIG. 40 is a schematic diagram illustrating a state where the fly-eye lens is irradiated with a laser beam L a beam width of which in a Y direction is expanded to B2 by the beam expander.
Figure 41:
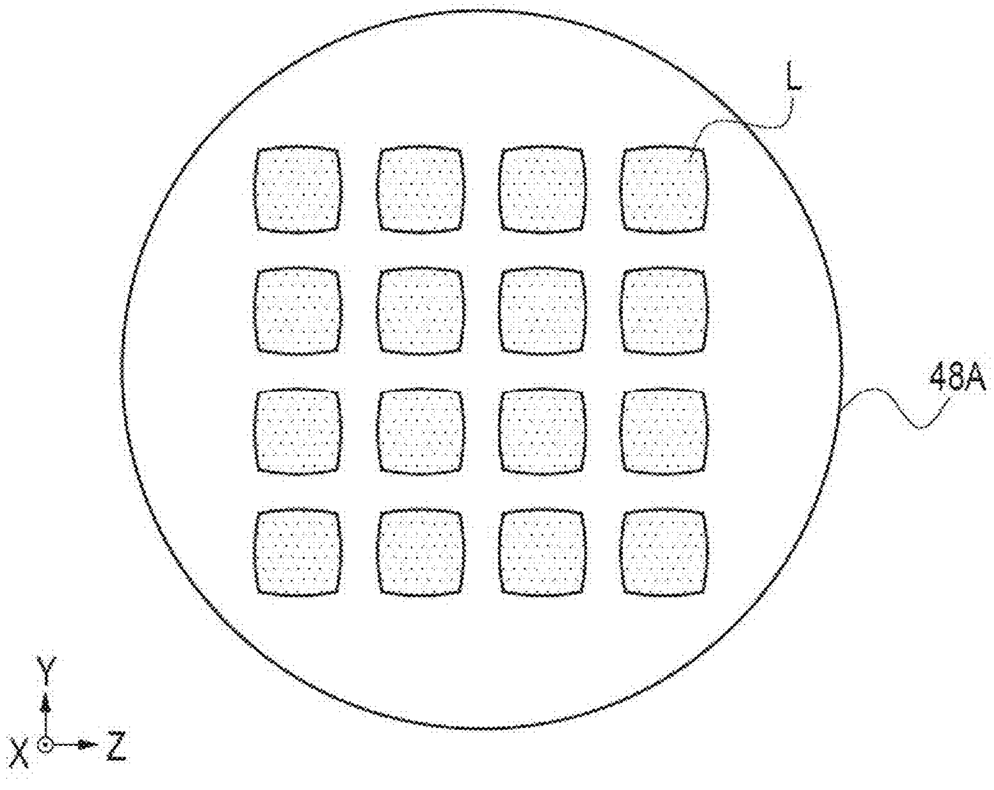
FIG. 41 is a schematic diagram illustrating a state where an effective area of the projection optical system is irradiated with the laser beam L having passed through a multipoint transfer mask.

FIG. 40 illustrates a state where the fly-eye lens 55 is irradiated with the laser beam L the beam width of which in the Y direction is expanded to B2 by the beam expander 50. The fly-eye lens 55 itself has a function of reducing the NA difference. The beam expander 50 is disposed to irradiate the entire surface of the fly-eye lens 55 with the laser beam L. FIG. 41 illustrates a state where the effective area 48A of the projection optical system 48 is irradiated with the laser beam L which has passed through the multipoint transfer mask 47C.

In the present example, the beam width of the laser beam L in the Y direction is expanded to B2 by the beam expander 50. Therefore, the fly-eye lens 55 is irradiated with the laser beam L output from the beam expander 50 with the large NA difference. The fly-eye lens 55 adjusts the laser beam L so as to reduce the NA difference of the laser beam L entering the condenser lens 56 and to uniformize the energy density. In the present example, the fly-eye lens 55 is an example of the "divergence angle adjusting optical system" according to the technology of the present disclosure.

The condenser lens 56 condenses the laser beam L output from the fly-eye lens 55, and is disposed such that the focal plane on the output side of the condenser lens 56 is on the multipoint transfer mask 47C.

The multipoint transfer mask 47C is, for example, a planar member which has a plurality of transmission holes through which a part of the laser beam L passes, and shields the other part of the laser beam L. In the present example, the transmission holes are formed of a plurality of circular holes. When the laser beam L passes through the transmission holes, the laser beam L is divided into a plurality of laser beams L to form the transfer pattern. When the transfer pattern is transferred to the workpiece 41, holes corresponding to the transfer pattern are formed in the workpiece 41.

4.2 Operation

Next, an operation of the laser processing apparatus 2C will be described mainly with respect to an operation that differs from the operation of the laser processing apparatus 2B according to the second embodiment.

As in the present example, the multipoint transfer mask 47C is irradiated with the laser beam L that has entered the laser processing apparatus main body 4C, via the high reflective mirror 36*a*, the attenuator 52, the high reflective mirror 36*b*, the introducing optical system 46, the beam expander 50, the fly-eye lens 55, and the condenser lens 56. When the beam expander 50, the fly-eye lens 55, and the condenser lens 56 are used, the multipoint transfer mask 47C is irradiated with the laser beam L having the reduced NA difference and the uniform light intensity.

As illustrated in FIG. 41, the effective area 48A of the projection optical system 48 is irradiated with the transfer pattern in which the NA difference of the laser beam L is reduced. Thus, the laser processing apparatus 2C can execute the drilling processing to the workpiece 41 with the laser beam L having the reduced NA difference of the laser beam L and the uniform light intensity.

4.3 Operation and Effects

As described above, the laser processing apparatus 2C forms a plurality of holes in the workpiece 41 by irradiating the workpiece 41 having the resin film 40 disposed on the processing surface with the laser beam L discharge-excited between the pair of electrodes 22*a* and 22*b* and then output, and includes: the laser apparatus 3 which outputs the laser beam L having the first divergence angle θ1 in the discharge direction between the pair of electrodes 22*a* and 22*b* larger than the second divergence angle θ2 in the direction perpendicular to the discharge direction and the traveling direction of the laser beam L; the multipoint transfer mask 47C which forms a plurality of circular patterns; the introducing optical system 46 for guiding the laser beam L to the multipoint transfer mask 47C; the beam expander 50 and the condenser lens 56 formed between the multipoint transfer mask 47C and the introducing optical system 46; the projection optical system 48 which images the circular patterns of the multipoint transfer mask 47C on the resin layer; and the fly-eye lens 55 which is disposed on the optical path of the laser beam L and adjusts the difference between the first divergence angle θ1 and the second divergence angle θ2 to be reduced.

According to such a laser processing apparatus 2C and the laser processing method, the drilling processing is executed to the workpiece 41 having the resin film 40 disposed thereon with the laser beam L having the reduced NA difference and the uniform light intensity. Therefore, the laser processing apparatus 2C according to the modification can simultaneously form a plurality of holes while suppressing bulging and cracking.

Figure 42:
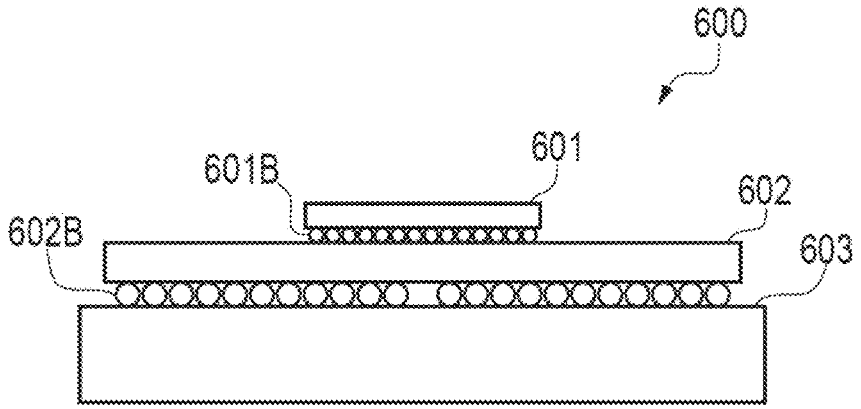
FIG. 42 is a schematic diagram illustrating a schematic configuration example of an electronic device.

5. Electronic Device Manufacturing Method Using Laser Processing Apparatus According to Present Disclosure FIG. 42 is a schematic diagram illustrating a schematic configuration example of an electronic device 600. The electronic device 600 illustrated in FIG. 42 includes an integrated circuit chip 601, an interposer 602, and a circuit board 603. The integrated circuit chip 601 is, for example, a chip-like integrated circuit board in which an integrated circuit is formed on a silicon substrate. The integrated circuit chip 601 is provided with a plurality of bumps 601B electrically connected to the integrated circuit. The interposer 602 includes an insulating substrate such as a glass substrate in which a plurality of through-holes are formed, and a conductor that electrically connects front and back surfaces of the substrate is provided in each of the through-holes. A plurality of lands connected to the bumps 601B provided in the integrated circuit chip 601 are formed on one surface of the interposer 602, and each land is electrically connected to one of the conductors in the through-holes. A plurality of bumps 602B are provided on the other surface of the interposer 602, and each bump 602B is electrically connected to one of the conductors in the through-holes. A plurality of lands connected to the respective bumps 602B are formed on one surface of the circuit board 603. The circuit board 603 includes a plurality of terminals electrically connected to the lands.

Figure 43:
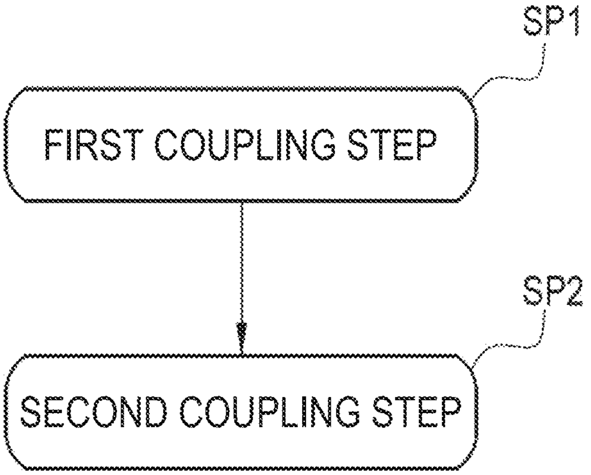
FIG. 43 is a flowchart illustrating an electronic device manufacturing method.

FIG. 43 is a flowchart illustrating a method of manufacturing the electronic device 600. As illustrated in FIG. 43, the method of manufacturing the electronic device 600 in the present description includes a first coupling step SP1 and a second coupling step SP2. In the first coupling step SP1, the integrated circuit chip 601 and the interposer 602 are coupled. Specifically, each bump 601B of the integrated circuit chip 601 is disposed on each land of the interposer 602 and the bump 601B and the land are electrically connected to each other. Thus, the integrated circuit chip 601 and the interposer 602 are electrically connected to each other. In the second coupling step SP2, the interposer 602 and the circuit board 603 are coupled. Specifically, each bump 602B of the interposer 602 is disposed on each land of the circuit board 603, and the bump 602B and the land are electrically connected to each other. Thus, the integrated circuit chip 601 is electrically connected to the circuit board 603 via the interposer 602. Through the above steps, the electronic device 600 is manufactured.

The laser processing apparatus according to the technology of the present disclosure is used for manufacturing the interposer 602 in the first coupling step SP1. Specifically, the laser beam L having passed through the divergence angle adjusting optical system according to the technology of the present disclosure has the reduced NA difference and the uniform light intensity. The substrate of the interposer 602 which is the workpiece 41 is irradiated with the laser beam L. At the irradiation position, the substrate of the interposer 602 is ablated to form a hole. The substrate of the interposer 602 is processed until the hole becomes a through-hole, and thereafter, the conductor is disposed inside the through-hole. Note that the hole formed in the substrate of the interposer 602 is not limited to the through-hole.

That is to say, the method of manufacturing the electronic device 600 includes the first coupling step SP1 of coupling and electrically connecting the interposer 602 and the integrated circuit chip 601 to each other and the second coupling step SP2 of coupling and electrically connecting the interposer 602 and the circuit board 603 to each other, the interposer 602 includes an insulating substrate in which a plurality of through-holes are formed and conductors provided in the through-holes, and the through-holes are formed by the laser processing method of forming the hole at each irradiation position of the laser beams L with which the insulating substrate is irradiated. The laser processing method includes generating the laser beam L having the first divergence angle θ1 in the discharge direction between the pair of discharge electrodes larger than the second divergence angle θ2 in the direction perpendicular to the discharge direction and the traveling direction of the laser beam L, reducing the difference between the first divergence angle θ1 and the second divergence angle θ2 of the laser beam L, then imaging the laser beam L on the insulating layer, and forming the through-holes in the glass substrate.

The description above is intended to be illustrative and the present disclosure is not limited thereto. Therefore, it would be obvious to those skilled in the art that various modifications to the embodiments of the present disclosure would be possible without departing from the scope of the appended claims.

The terms used throughout the present specification and the appended claims should be interpreted as non-limiting terms. For example, the terms "include" and "be included" should be interpreted as "including the stated elements but not limited to the stated elements." The term "have" should be interpreted as "having the stated elements but not limited to the stated elements." Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. A laser processing apparatus which forms a hole in a workpiece having a resin layer disposed on a processing surface by irradiating the workpiece with a laser beam discharge-excited between a pair of discharge electrodes and then output, the laser processing apparatus comprising:

a laser apparatus configured to output the laser beam having a first divergence angle in a discharge direction between the pair of discharge electrodes larger than a second divergence angle in a direction perpendicular to the discharge direction and a traveling direction of the laser beam;

a transfer mask configured to form a transfer pattern;

an introducing optical system for guiding the laser beam to the transfer mask;

a projection optical system configured to image the transfer pattern on the resin layer; and a divergence angle adjusting optical system disposed on an optical path of the laser beam and configured to adjust a difference between the first divergence angle and the second divergence angle to be reduced.

2. The laser processing apparatus according to claim 1, wherein the resin layer is made of a polyimide or a fluorine-based polymer material, and the workpiece is a glass substrate.

3. The laser processing apparatus according to claim 1, wherein the divergence angle adjusting optical system includes a circular opening, and is disposed on an optical path between the transfer mask and the workpiece so that the laser beam passes through the circular opening.

4. The laser processing apparatus according to claim 1, wherein the divergence angle adjusting optical system includes a rectangular opening, and is disposed on an optical path between the transfer mask and the workpiece so that the laser beam passes through the rectangular opening.

5. The laser processing apparatus according to claim 1, wherein the divergence angle adjusting optical system is a beam expander configured to expand a beam width of the laser beam relating to the first divergence angle.

6. The laser processing apparatus according to claim 1, wherein the divergence angle adjusting optical system is a beam expander configured to reduce a beam width of the laser beam relating to the second divergence angle.

7. The laser processing apparatus according to claim 1, wherein the transfer mask is a multipoint transfer mask.

8. The laser processing apparatus according to claim 7, wherein the transfer mask includes a plurality of transmission holes, the divergence angle adjusting optical system is a fly-eye lens, and a beam expander for guiding the laser beam to the fly-eye lens is provided.

9. The laser processing apparatus according to claim 1, wherein the laser beam is an ArF laser beam.

10. A laser processing method for forming a hole in a workpiece having a resin layer disposed on a processing surface by irradiating the workpiece with a laser beam discharge-excited between a pair of discharge electrodes and then output, the laser processing method comprising:

a workpiece setting step of setting the workpiece on which the resin layer is disposed on a table of a moving stage;

a transfer positioning step of performing relative positioning between a transfer position and the workpiece such that the transfer position and a surface of the resin layer coincide;

a laser outputting step of outputting the laser beam, having a first divergence angle in a discharge direction between a pair of discharge electrodes larger than a second divergence angle in a direction perpendicular to the discharge direction and a traveling direction of the laser beam, to the workpiece on which the resin layer is disposed;

an introducing optical step of guiding the laser beam to a transfer mask;

a transfer pattern forming step of forming a transfer pattern;

a transfer imaging step of imaging the transfer pattern on the resin layer; and a divergence angle adjusting step of adjusting a difference between the first divergence angle and the second divergence angle to be reduced.

11. The laser processing method according to claim 10, wherein in the divergence angle adjusting step, the laser beam passes through a circular opening of a divergence angle adjusting optical system disposed on an optical path between the transfer mask and the workpiece.

12. The laser processing method according to claim 10, wherein in the divergence angle adjusting step, the laser beam passes through a rectangular opening of a divergence angle adjusting optical system disposed on an optical path between the transfer mask and the workpiece.

13. The laser processing method according to claim 10, wherein in the divergence angle adjusting step, a beam width of the laser beam relating to the first divergence angle is expanded.

14. The laser processing method according to claim 10, wherein the transfer mask is a multipoint transfer mask.

15. An electronic device manufacturing method comprising:

a first coupling step of coupling and electrically connecting an interposer and an integrated circuit chip to each other; and a second coupling step of coupling and electrically connecting the interposer and a circuit board to each other, the interposer including an insulating substrate in which a plurality of through-holes are formed and conductors provided in the through-holes, the through-holes being formed by a laser processing method of forming a hole at each irradiation position of a plurality of laser beams with which the insulating substrate having a processing surface with a resin layer disposed thereon is irradiated, and the laser processing method including generating the laser beam having a first divergence angle in a discharge direction between a pair of discharge electrodes larger than a second divergence angle in a direction perpendicular to the discharge direction and a traveling direction of the laser beam, reducing a difference between the first divergence angle and the second divergence angle of the laser beam, and then imaging the laser beam on the resin layer to form the through-holes in the insulating substrate.

16. The electronic device manufacturing method according to claim 15, wherein the laser processing method further includes reducing the difference between the first divergence angle and the second divergence angle by having the laser beam pass through a circular opening of a divergence angle adjusting optical system disposed on an optical path between a transfer mask and a workpiece.

17. The electronic device manufacturing method according to claim 15, wherein the laser processing method further includes reducing the difference between the first divergence angle and the second divergence angle by having the laser beam pass through a rectangular opening of a divergence angle adjusting optical system disposed on an optical path between a transfer mask and a workpiece.

18. The electronic device manufacturing method according to claim 15, wherein the laser processing method further includes reducing the difference between the first divergence angle and the second divergence angle by expanding a beam width of the laser beam relating to the first divergence angle.

19. The electronic device manufacturing method according to claim 15, wherein the laser processing method further includes guiding the laser beam to a multipoint transfer mask.

* * * * *